United States Patent
Ohsawa et al.

(10) Patent No.: US 10,276,786 B2
(45) Date of Patent: Apr. 30, 2019

(54) MAGNETIC MEMORY

(71) Applicant: Kabushiki Kaisha Toshiba, Minato-ku (JP)

(72) Inventors: Yuichi Ohsawa, Yokohama (JP); Mariko Shimizu, Setagaya (JP); Satoshi Shirotori, Yokohama (JP); Hideyuki Sugiyama, Kawasaki (JP); Altansargai Buyandalai, Kawasaki (JP); Hiroaki Yoda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/905,907

(22) Filed: Feb. 27, 2018

(65) Prior Publication Data
US 2019/0088858 A1    Mar. 21, 2019

(30) Foreign Application Priority Data
Sep. 20, 2017   (JP) .................. 2017-179699

(51) Int. Cl.
*G11C 11/00*   (2006.01)
*H01L 43/08*   (2006.01)
(Continued)

(52) U.S. Cl.
CPC ............ *H01L 43/08* (2013.01); *G11C 11/161* (2013.01); *G11C 11/1675* (2013.01);
(Continued)

(58) Field of Classification Search
CPC ....... H01L 43/08; H01L 43/12; H01L 27/228; H01L 43/02; H01L 43/10; G11C 11/1675; G11C 11/161
(Continued)

(56) References Cited

U.S. PATENT DOCUMENTS

2003/0111626 A1\* 6/2003 Hosotani ............... B82Y 10/00
                                                                                  251/200
2014/0070342 A1\* 3/2014 Sandhu ................. H01L 43/08
                                                                                  257/421
(Continued)

FOREIGN PATENT DOCUMENTS

JP    2010-80649 A    4/2010
JP    2017-112358    6/2017
(Continued)

OTHER PUBLICATIONS

H. Yoda, et al., "Voltage-Control Spintronics Memory (VoCSM) Having Potentials of Ultra-Low Energy-Consumption and High-Density," IEEE 2016, pp. IEDM16-679 to IEDM16-682.
(Continued)

*Primary Examiner* — Tha-O H Bui
(74) *Attorney, Agent, or Firm* — Oblon, McClelland, Maier & Neustadt, L.L.P.

(57) ABSTRACT

According to one embodiment, a magnetic memory device includes a first conductive layer, a first magnetic layer, a first nonmagnetic layer, a second magnetic layer, a second conductive layer, a third magnetic layer, a second nonmagnetic layer, a fourth magnetic layer provided, a first compound region, and a first insulating region. The first compound region includes the first metal and at least one selected from the group consisting of oxygen, nitrogen, and fluorine. At least a portion of the first compound region is provided between the first conductive layer and the second conductive layer. The first insulating region includes at least one selected from the group consisting of Al and Si and at least one selected from the group consisting of oxygen, nitrogen, and fluorine. At least a portion of the first insulating region is provided between the first magnetic layer and the third magnetic layer.

21 Claims, 16 Drawing Sheets

(51) Int. Cl.
    *G11C 11/16*     (2006.01)
    *H01L 43/02*     (2006.01)
    *H01L 27/22*     (2006.01)
    *H01L 43/12*     (2006.01)
    *H01L 43/10*     (2006.01)

(52) U.S. Cl.
    CPC ............ *H01L 27/228* (2013.01); *H01L 43/02* (2013.01); *H01L 43/12* (2013.01); *H01L 43/10* (2013.01)

(58) Field of Classification Search
    USPC ........................................................ 365/158
    See application file for complete search history.

(56) References Cited

U.S. PATENT DOCUMENTS

| | | |
|---|---|---|
| 2017/0117323 A1 | 4/2017 | Braganca et al. |
| 2018/0040812 A1 | 2/2018 | Shimizu et al. |
| 2018/0277185 A1 | 9/2018 | Shimizu et al. |

FOREIGN PATENT DOCUMENTS

| | | |
|---|---|---|
| JP | 2018-022805 | 2/2018 |
| JP | 6283437 B1 | 2/2018 |

OTHER PUBLICATIONS

Shirotori Satoshi, et al., "Voltage-Control Spintronics Memory (VoCSM) with a self-aligned heavy-metal electrode," Digest of Intermag 2017, 5 Pages.

\* cited by examiner

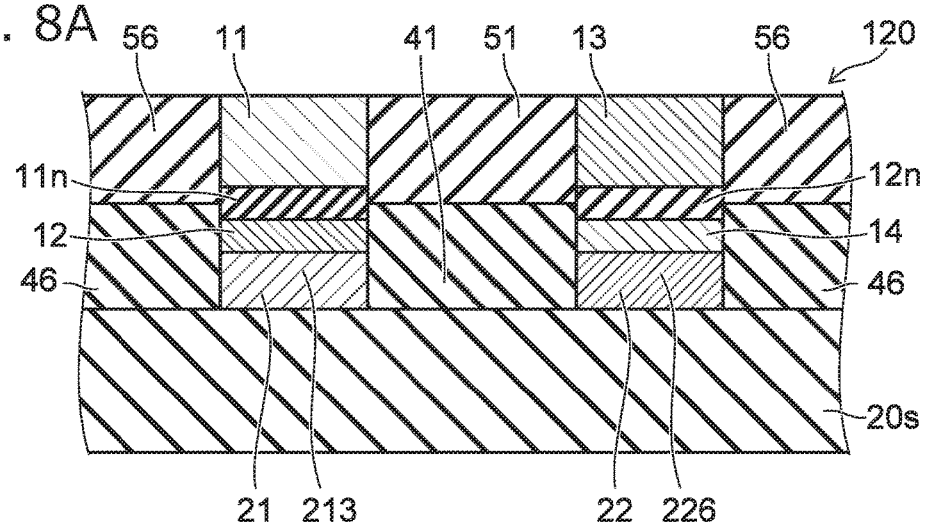
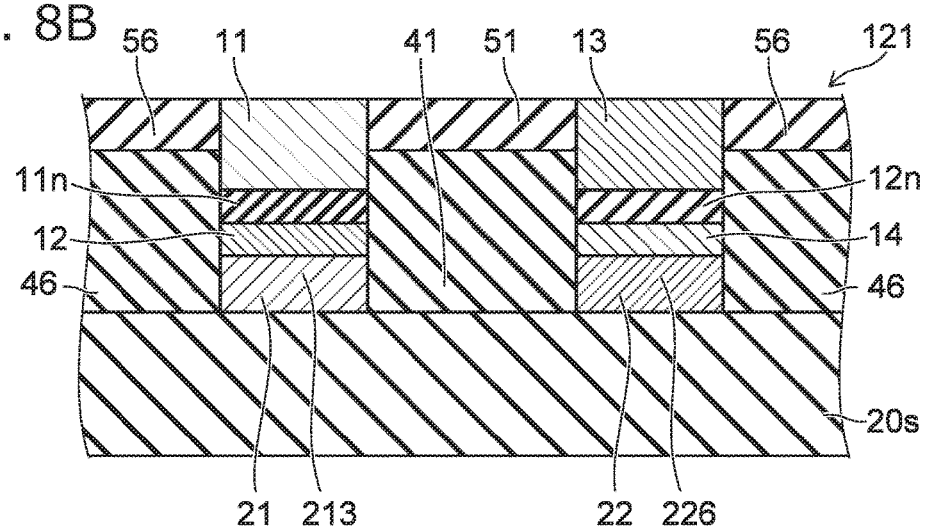
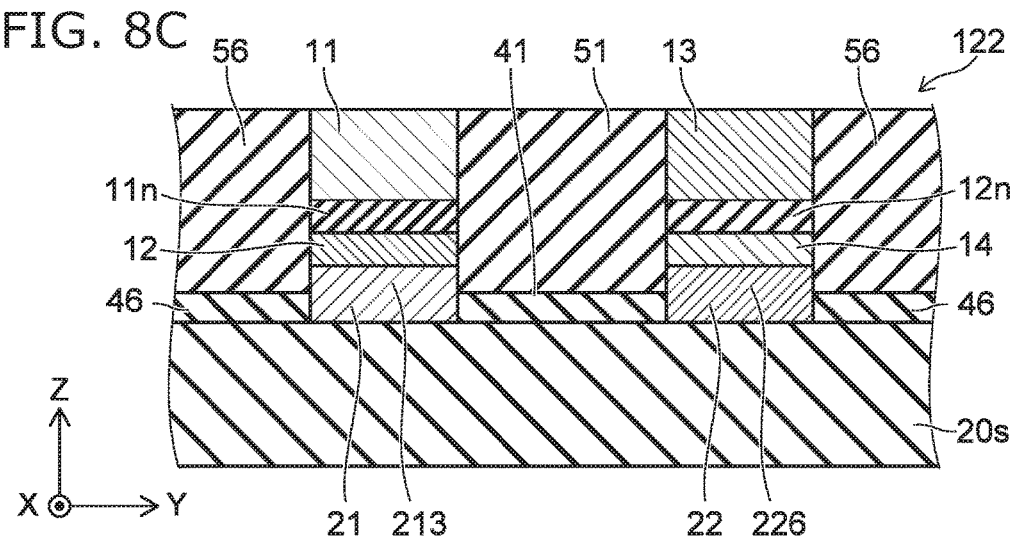

MAGNETIC MEMORY

CROSS-REFERENCE TO RELATED APPLICATIONS

This application is based upon and claims the benefit of priority from Japanese Patent Application No. 2017-179699, filed on Sep. 20, 2017; the entire contents of which are incorporated herein by reference.

FIELD

Embodiments described herein relate generally to a magnetic memory.

BACKGROUND

It is desirable for the operations of a magnetic memory device to be more stable.

BRIEF DESCRIPTION OF THE DRAWINGS

FIG. 8A to FIG. 11B are schematic cross-sectional views illustrating other magnetic memory devices according to the first embodiment;

DETAILED DESCRIPTION

Figure 1:
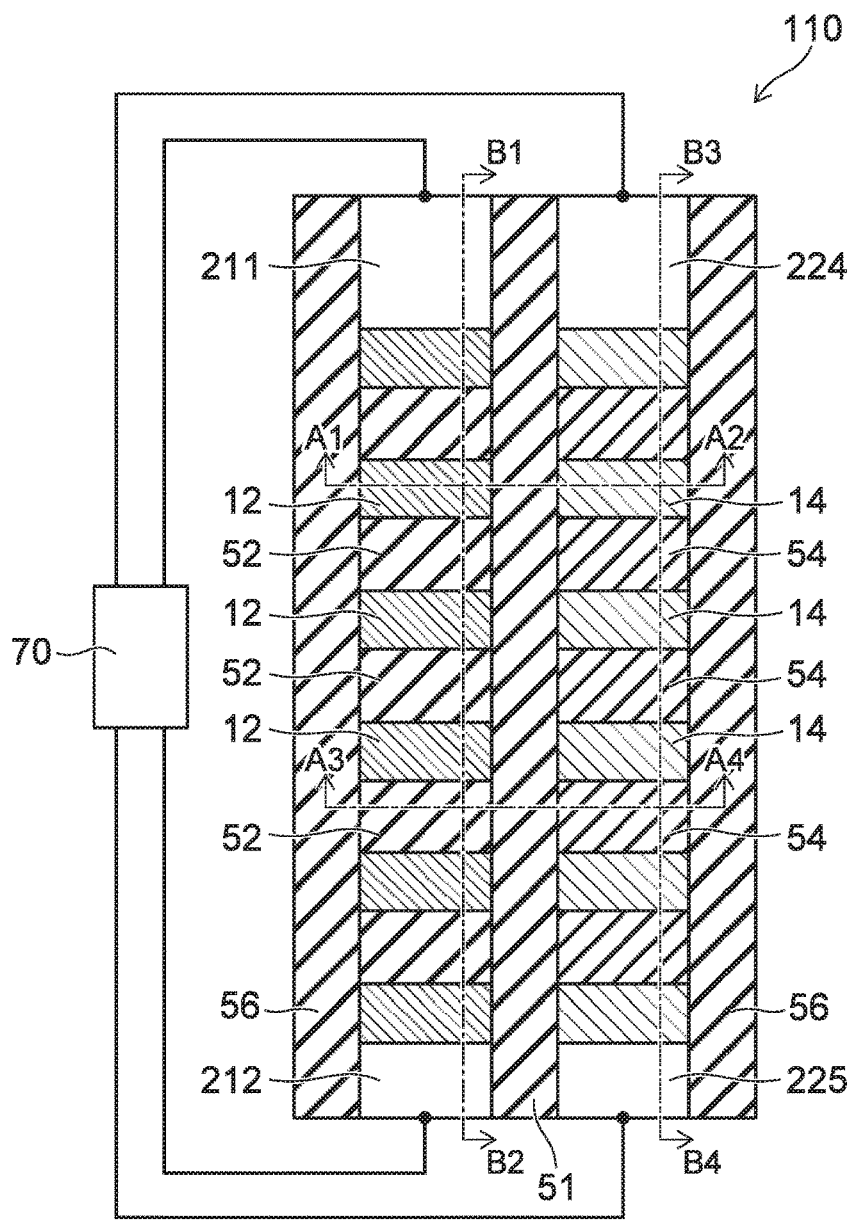
FIG. 1 to FIG. 3B are schematic cross-sectional views illustrating a magnetic memory device according to a first embodiment.

According to one embodiment, a magnetic memory device includes a first conductive layer, a first magnetic layer, a first nonmagnetic layer, a second magnetic layer, a second conductive layer, a third magnetic layer, a second nonmagnetic layer, a fourth magnetic layer provided, a first compound region, and a first insulating region. The first conductive layer includes a first metal. The first conductive layer includes a first portion, a second portion, and a third portion between the first portion and the second portion. The first magnetic layer is separated from the third portion in a first direction crossing a second direction. The second direction is from the first portion toward the second portion. The first nonmagnetic layer is provided between the third portion and the first magnetic layer. The second magnetic layer is provided between the third portion and the first nonmagnetic layer. The second conductive layer includes the first metal. The second conductive layer is separated from the first conductive layer in a third direction. The third direction crosses a plane including the first direction and the second direction. The third magnetic layer is separated from the second conductive layer in the first direction. The second nonmagnetic layer is provided between the second conductive layer and the third magnetic layer. The fourth magnetic layer is provided between the second conductive layer and the second nonmagnetic layer. The first compound region includes the first metal and at least one selected from the group consisting of oxygen, nitrogen, and fluorine. At least a portion of the first compound region is provided between the first conductive layer and the second conductive layer in the third direction. The first insulating region includes at least one selected from the group consisting of Al and Si and at least one selected from the group consisting of oxygen, nitrogen, and fluorine. At least a portion of the first insulating region is provided between the first magnetic layer and the third magnetic layer.

Embodiments of the invention will now be described with reference to the drawings. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated. In the drawings and the specification of the application, components similar to those described thereinabove are marked with like reference numerals, and a detailed description is omitted as appropriate.

FIG. 1 to FIG. 3B are schematic cross-sectional views illustrating a magnetic memory device according to a first embodiment.

Figure 2A:
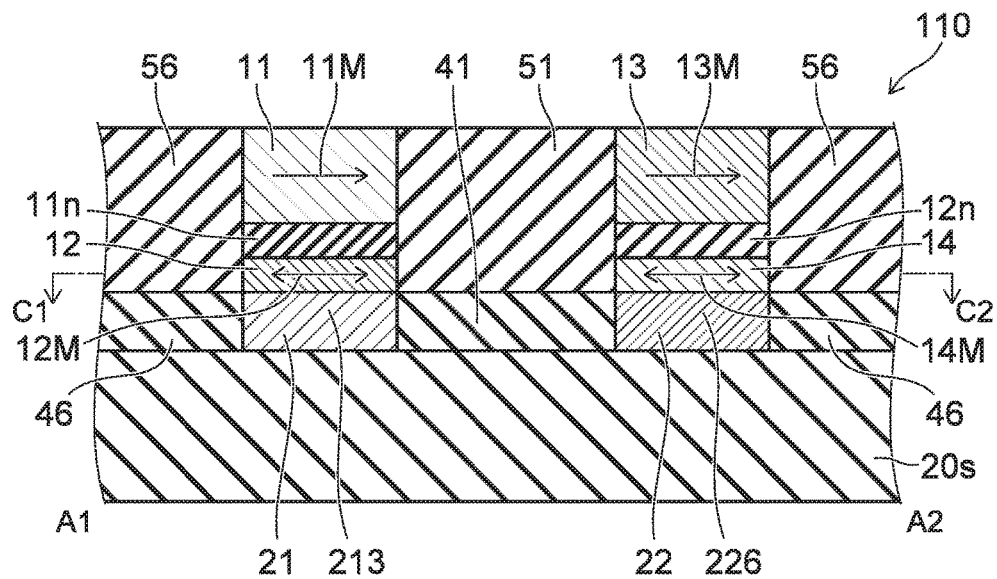
Figure 2B:
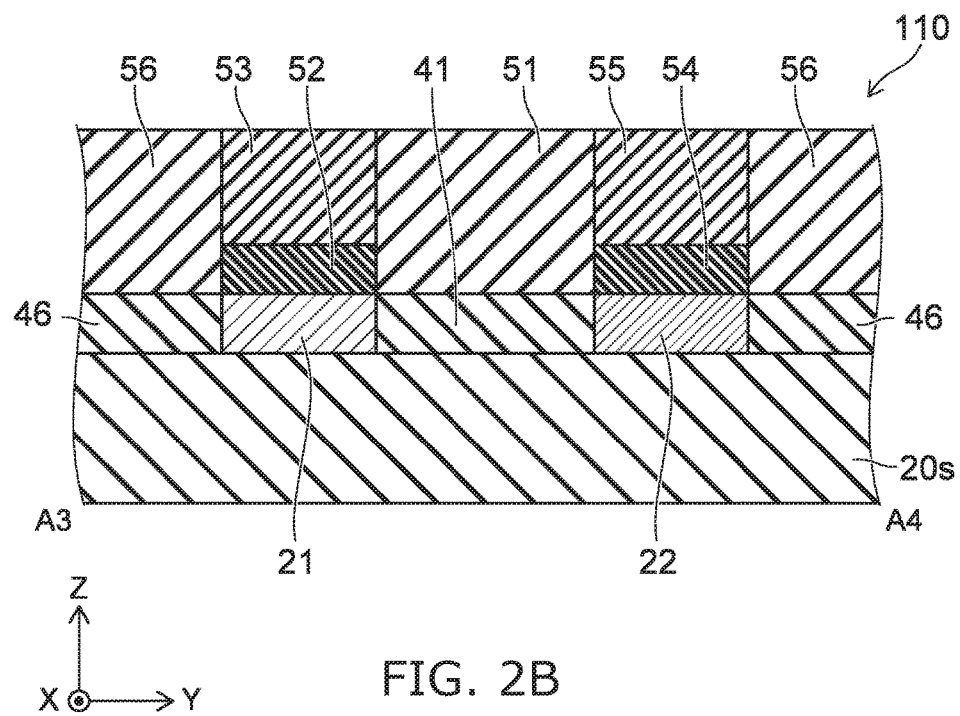
Figure 3A:
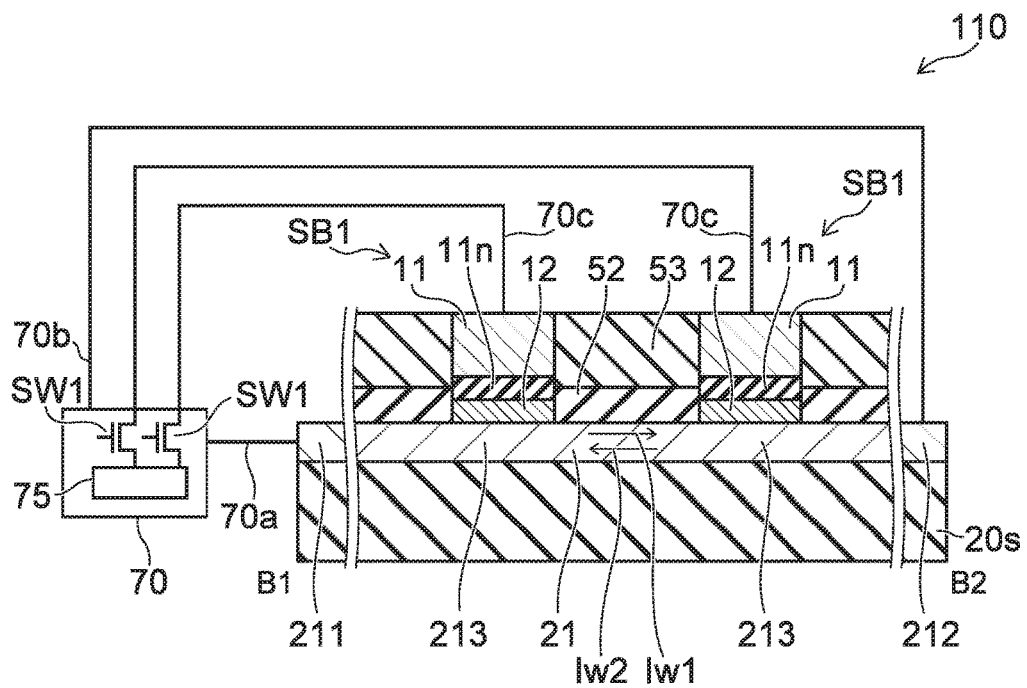
Figure 3B:
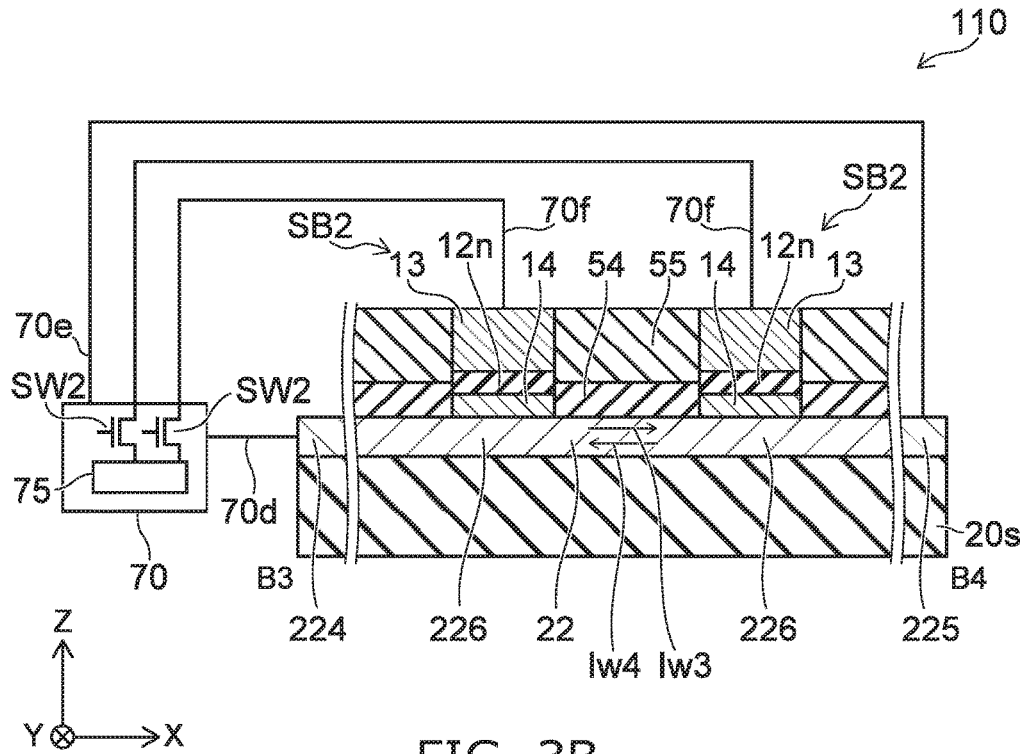

FIG. 2A is a line A1-A2 cross section of FIG. 1. FIG. 2B is a line A3-A4 cross section of FIG. 1. FIG. 3A is a line B1-B2 cross section of FIG. 1. FIG. 3B is a line B3-B4 cross section of FIG. 1. FIG. 1 is a line C1-C2 cross section of FIG. 2A.

As illustrated in FIG. 1, FIG. 2A, FIG. 2B, FIG. 3A, and FIG. 3B, the magnetic memory device 110 according to the first embodiment includes a first magnetic layer 11, a first nonmagnetic layer 11n, a second magnetic layer 12, a second nonmagnetic layer 12n, a third magnetic layer 13, a fourth magnetic layer 14, a first conductive layer 21, a second conductive layer 22, a first compound region 41, and a controller 70.

As illustrated in FIG. 3A, the first conductive layer 21 includes a first portion 211, a second portion 212, and a third portion 213. The third portion 213 is provided between the first portion 211 and the second portion 212.

The direction from the first portion 211 toward the second portion 212 is taken as a first direction. For example, the first direction is aligned with an X-axis direction illustrated in FIG. 3B. One direction perpendicular to the X-axis direction is taken as a Y-axis direction. A direction perpendicular to the X-axis direction and the Y-axis direction is taken as a Z-axis direction. A direction crossing the first direction is taken as a second direction. For example, the second direction is aligned with the Z-axis direction. A direction crossing the first direction and the second direction is taken as a third direction. For example, the third direction is aligned with the Y-axis direction.

The case will now be described where the first direction, the second direction, and the third direction are aligned respectively with the X-axis direction, the Z-axis direction, and the Y-axis direction.

The first magnetic layer 11 is separated from the third portion 213 in the Z-axis direction. The first nonmagnetic layer 11n is provided between the third portion 213 and the first magnetic layer 11. The second magnetic layer 12 is provided between the third portion 213 and the first nonmagnetic layer 11n.

For example, the first conductive layer 21 includes multiple third portions 213. The multiple third portions 213 are separated from each other in the X-axis direction. A first stacked body SB1 that includes the first magnetic layer 11, the first nonmagnetic layer 11n, and the second magnetic layer 12 is multiply provided in the X-axis direction. The multiple first stacked bodies SB1 are separated from each other. The directions from the multiple third portions 213 toward the multiple first stacked bodies SB1 are aligned with the Z-axis direction.

As illustrated in FIG. 3B, the second conductive layer 22 includes a fourth portion 224, a fifth portion 225, and a sixth portion 226. The sixth portion 226 is provided between the first portion 211 and the second portion 212 in the X-axis direction.

The third magnetic layer 13 is separated from the sixth portion 226 in the Z-axis direction. The second nonmagnetic layer 12n is provided between the sixth portion 226 and the third magnetic layer 13. The fourth magnetic layer 14 is provided between the sixth portion 226 and the second nonmagnetic layer 12n.

The second conductive layer 22 includes, for example, multiple sixth portions 226. The multiple sixth portions 226 are separated from each other in the X-axis direction. A second stacked body SB2 that includes the third magnetic layer 13, the second nonmagnetic layer 12n, and the fourth magnetic layer 14 is multiply provided in the X-axis direction. The multiple second stacked bodies SB2 are separated from each other. The directions from the multiple sixth portions 226 toward the multiple second stacked bodies SB2 are aligned with the Z-axis direction.

As illustrated in FIG. 2A, the second conductive layer 22 is separated from the first conductive layer 21 in the Y-axis direction. The first compound region 41 is provided between at least a portion of the first conductive layer 21 and at least a portion of the second conductive layer 22 in the Y-axis direction. For example, the first compound region 41 is continuous with at least a portion of the first conductive layer 21 and at least a portion of the second conductive layer 22. For example, the first compound region 41 is connected physically to at least a portion of the first conductive layer 21 and at least a portion of the second conductive layer 22. For example, the first compound region 41 is connected atomically to at least a portion of the first conductive layer 21 and at least a portion of the second conductive layer 22.

A first insulating region 51 is provided between at least a portion of the first magnetic layer 11 and at least a portion of the third magnetic layer 13 in the Y-axis direction. In the example, the first insulating region 51 is further provided between the first nonmagnetic layer 11n and the second nonmagnetic layer 12n and between the second magnetic layer 12 and the fourth magnetic layer 14 in the Y-axis direction. The direction from the first compound region 41 toward the first insulating region 51 is aligned with the Z-axis direction.

The first conductive layer 21 includes a first metal. The second conductive layer 22 includes the first metal. The first compound region 41 includes the first metal and at least one selected from the group consisting of oxygen, nitrogen, and fluorine. The first metal is, for example, nonmagnetic. The first conductive layer 21 is, for example, nonmagnetic. The second conductive layer 22 is, for example, nonmagnetic.

The first metal includes at least one selected from the group consisting of Hf, Ta, W, Re, Os, Ir, Pt, Pd, Cu, Ag, and Au. More favorably, the first metal includes at least one selected from the group consisting of Hf, W, Re, Os, Ir, Pt, Pd, Cu, Ag, and Au. The electrical resistance of the first compound region 41 is larger in the case where the first compound region 41 includes at least one of the elements recited above other than Ta and at least one selected from the group consisting of oxygen, nitrogen, and fluorine than in the case where the first compound region 41 includes Ta and at least one selected from the group consisting of oxygen, nitrogen, and fluorine. For example, the electrical resistance between the first conductive layer 21 and the second conductive layer 22 can be large. It is favorable for the first conductive layer 21 and the second conductive layer 22 to be nonmagnetic.

The first magnetic layer 11, the second magnetic layer 12, the third magnetic layer 13, and the fourth magnetic layer 14 include, for example, at least one first element selected from the group consisting of Fe, Co, and Ni. The first magnetic layer 11, the second magnetic layer 12, the third magnetic layer 13, and the fourth magnetic layer 14 include, for example, CoFeB.

The first nonmagnetic layer 11n and the second nonmagnetic layer 12n include at least one selected from the group consisting of MgO, CaO, SrO, TiO, VO, NbO, and $Al_2O_3$.

The first insulating region 51 includes at least one selected from the group consisting of Al and Si and at least one selected from the group consisting of oxygen, nitrogen, and fluorine. The first insulating region 51 includes, for example, aluminum oxide or silicon oxide.

In the example, the magnetic memory device 110 further includes a base body 20s, a compound region 46, the first insulating region 51, insulating regions 52 to 55, and multiple insulating regions 56.

The first conductive layer 21 is provided between the base body 20s and the second magnetic layer 12 in the Z-axis direction. The second conductive layer 22 is provided between the base body 20s and the fourth magnetic layer 14 in the Z-axis direction.

The multiple compound regions 46 are separated from each other in the Y-axis direction. At least a portion of the first conductive layer 21 is provided between the first compound region 41 and one of the multiple compound regions 46 in the Y-axis direction. At least a portion of the second conductive layer 22 is provided between the first compound region 41 and another one of the multiple compound regions 46 in the Y-axis direction.

The multiple insulating regions 56 are separated from each other in the Y-axis direction. At least a portion of the first magnetic layer 11 is provided between the first insulating region 51 and one of the multiple insulating regions 56 in the Y-axis direction. At least a portion of the third magnetic layer 13 is provided between the first insulating region 51 and another one of the multiple insulating regions 56 in the Y-axis direction.

As illustrated in FIG. 3A and FIG. 2B, the insulating region 52 is provided between one of the multiple second magnetic layers 12 and another one of the multiple second magnetic layers 12 in the X-axis direction. The insulating region 53 is provided between one of the multiple first magnetic layers 11 and another one of the multiple first magnetic layers 11. A portion of the insulating region 53 may be provided instead of the insulating region 52.

As illustrated in FIG. 3B and FIG. 2B, the insulating region 54 is provided between one of the multiple fourth magnetic layers 14 and another one of the multiple fourth magnetic layers 14 in the X-axis direction. The insulating region 55 is provided between one of the multiple fourth magnetic layers 14 and another one of the multiple fourth magnetic layers 14. A portion of the insulating region 55 may be provided instead of the insulating region 54.

The insulating regions 52 and 54 include, for example, at least one first element selected from the group consisting of Fe, Co, and Ni and at least one selected from the group consisting of oxygen, nitrogen, and fluorine. The insulating regions 53 and 55 include, for example, at least one selected from the group consisting of Al and Si and at least one selected from the group consisting of oxygen, nitrogen, and fluorine.

The first magnetic layer 11 and the third magnetic layer 13 are, for example, fixed magnetic layers. The second magnetic layer 12 and the fourth magnetic layer 14 are, for example, free magnetic layers. A first magnetization 11M of the first magnetic layer 11 does not change easily compared to a second magnetization 12M of the second magnetic layer 12. A third magnetization 13M of the third magnetic layer 13 does not change easily compared to a fourth magnetization 14M of the fourth magnetic layer 14. The first nonmagnetic layer 11n and the second nonmagnetic layer 12n function as, for example, tunneling layers.

The stacked bodies (the first stacked body SB1, the second stacked body SB2, etc.) function as, for example, magnetic variable resistance elements. For example, a TMR (Tunnel Magneto Resistance Effect) occurs in the stacked bodies. For example, the electrical resistance of a path including the first magnetic layer 11, the first nonmagnetic layer 11n, and the second magnetic layer 12 changes according to the difference between the orientation of the first magnetization 11M and the orientation of the second magnetization 12M. For example, the electrical resistance of a path including the third magnetic layer 13, the second nonmagnetic layer 12n, and the fourth magnetic layer 14 changes according to the difference between the orientation of the third magnetization 13M and the orientation of the fourth magnetization 14M. The stacked body includes, for example, a magnetic tunnel junction (MTJ).

In the example, the first magnetization 11M and the third magnetization 13M are aligned with the Y-axis direction. The second magnetization 12M and the fourth magnetization 14M are aligned with the Y-axis direction. The first magnetic layer 11 and the third magnetic layer 13 function as, for example, reference layers. The second magnetic layer 12 and the fourth magnetic layer 14 function as, for example, memory layers.

The second magnetic layer 12 and the fourth magnetic layer 14 function as, for example, layers that store information. For example, a first state in which the second magnetization 12M is oriented in one direction corresponds to first information to be stored. A second state in which the second magnetization 12M is oriented in another direction corresponds to second information to be stored. The first information corresponds to, for example, one of "0" or "1." The second information corresponds to the other of "0" or "1." Similarly, the orientation of the fourth magnetization 14M corresponds to such information.

The second magnetization 12M can be controlled by, for example, a current (a write current) flowing in the first conductive layer 21. The orientation of the second magnetization 12M can be controlled by, for example, the orientation of the current (the write current) of the first conductive layer 21. For example, the first conductive layer 21 functions as a Spin Orbit Layer (SOL). For example, the orientation of the second magnetization 12M can be changed by a spin-orbit torque generated between the first conductive layer 21 and the second magnetic layer 12. For example, the orientation of the fourth magnetization 14M can be changed by a spin-orbit torque generated between the first conductive layer 21 and the fourth magnetic layer 14. The spin-orbit torque is based on the current (the write current) flowing in the first conductive layer 21.

The current (the write current) is supplied by the controller 70. The controller includes, for example, a drive circuit 75. As illustrated in FIG. 3A, the controller 70 is electrically connected to the first portion 211, the second portion 212, and the multiple first magnetic layers 11.

For example, the drive circuit 75 and the first portion 211 are electrically connected by an interconnect 70a. The drive circuit 75 and the second portion 212 are electrically connected by an interconnect 70b. The drive circuit 75 and the multiple first magnetic layers 11 are electrically connected respectively by multiple interconnects 70c. For example, first switch elements Sw1 (e.g., transistors) are provided in the current paths (the interconnects 70c) between the drive circuit 75 and the first magnetic layers 11.

In a first write operation, the controller 70 supplies a first current Iw1 (a first write current) to the first conductive layer 21. Thereby, the first state is formed. The first current Iw1 is a current from the first portion 211 toward the second portion 212. In a second write operation, the controller 70 supplies a second current Iw2 (a second write current) to the first conductive layer 21. Thereby, the second state is formed. The second current Iw2 is a current from the second portion 212 toward the first portion 211.

A first electrical resistance between the first magnetic layer 11 and the first portion 211 after the first write operation (in the first state) is different from a second electrical resistance between the first magnetic layer 11 and the first portion 211 after the second write operation (in the second state). The electrical resistance difference is based on, for example, the difference of the states of the second magnetization 12M between the first state and the second state.

One of the multiple first stacked bodies SB1 is selected by the operations of the multiple first switch elements Sw1. The write operation and the read operation of the selected first stacked body SB1 can be performed. When selecting the one of the multiple first stacked bodies SB1, a prescribed select voltage is applied to the first stacked body SB1. At this time, an unselect voltage is applied to the other first stacked bodies SB1. The potential of the select voltage is different from the potential of the unselect voltage. As long as the potential of the select voltage is different from the potential of the unselect voltage, the select voltage may be 0 volts.

In the read operation, the controller 70 may sense a characteristic (which may be a voltage, a current, etc.) corresponding to the electrical resistance between the first magnetic layer 11 and the first portion 211. In the read operation, the controller 70 may sense a characteristic (which may be a voltage, a current, etc.) corresponding to the electrical resistance between the third magnetic layer 13 and the first portion 211.

Similarly, as illustrated in FIG. 3B, the controller 70 is electrically connected to the fourth portion 224, the fifth portion 225, and the multiple third magnetic layers 13. In the example, the drive circuit 75 and the fourth portion 224 are electrically connected by an interconnect 70d. The drive circuit 75 and the fifth portion 225 are electrically connected by an interconnect 70e. The drive circuit 75 and the multiple third magnetic layers 13 are electrically connected respectively by multiple interconnects 70f. For example, second switch elements Sw2 (e.g., transistors) are provided in the current paths (the interconnects 70f) between the drive circuit 75 and the third magnetic layer 13.

In a third write operation, the controller 70 supplies a third current Iw3 (a third write current) to the second conductive layer 22. Thereby, a third state is formed. The third current Iw3 is a current from the fourth portion 224 toward the fifth portion 225. In a fourth write operation, the controller 70 supplies a fourth current Iw4 (a fourth write current) to the second conductive layer 22. Thereby, a fourth state is formed. The fourth current Iw4 is a current from the fifth portion 225 toward the fourth portion 224.

A third electrical resistance between the third magnetic layer 13 and the fourth portion 224 after the third write operation (in the third state) is different from a fourth electrical resistance between the third magnetic layer 13 and the fourth portion 224 after the fourth write operation (in the fourth state). The electrical resistance difference is based on, for example, the difference of the states of the fourth magnetization 14M between the third state and the fourth state.

One of the multiple second stacked bodies SB2 is selected by the operations of the multiple second switch elements Sw2. The write operation and the read operation of the selected second stacked body SB2 can be performed. When selecting the one of the multiple second stacked bodies SB2, a prescribed select voltage is applied to the second stacked body SB2. At this time, an unselect voltage is applied to the other second stacked bodies SB2. The potential of the select voltage is different from the potential of the unselect voltage. As long as the potential of the select voltage is different from the potential of the unselect voltage, the select voltage may be 0 volts.

In the read operation, the controller 70 may sense a characteristic (which may be a voltage, a current, etc.) corresponding to the electrical resistance between the third magnetic layer 13 and the fourth portion 224. In the read operation, the controller 70 may sense a characteristic (which may be a voltage, a current, etc.) corresponding to the electrical resistance between the third magnetic layer 13 and the fourth portion 224.

The first conductive layer 21 includes the first metal. The first compound region 41 includes the first metal and at least one selected from the group consisting of oxygen, nitrogen, and fluorine. Thereby, for example, the stability of the operations of the magnetic memory device 110 increases. This is based on the decrease of the grain boundaries toward the end portion in the Y-axis direction of the first conductive layer 21 at the boundary vicinity between the first conductive layer 21 and the first compound region 41. For example, the decrease of the grain boundaries reduces migration in the first conductive layer 21 when supplying the current to the first conductive layer 21. In particular, in the case where the length in the Z-axis direction of the first conductive layer 21 is 15 nm or less and the first conductive layer 21 includes a transition metal, the migration in the first conductive layer 21 is reduced effectively.

Similarly, the second conductive layer 22 includes the first metal. Thereby, for example, the stability of the operations of the magnetic memory device 110 increases. This is based on the decrease of the grain boundaries of the second conductive layer 22 at the boundary vicinity between the second conductive layer 22 and the first compound region 41.

The magnetic memory device 110 includes the first compound region 41 and the first insulating region 51. Thereby, for example, the reliability of the magnetic memory device 110 in which the write operation and the read operation are performed by applying the select voltage to one of the multiple stacked bodies can be increased. The voltage effect of the magnetic memory device 110 can be improved. For example, the speed of the write operation and the read operation in the magnetic memory device 110 can be increased.

The first compound region 41 includes at least one first metal selected from the group consisting of Hf, Ta, W, Re, Os, Ir, Pt, Pd, Cu, Ag, and Au and at least one selected from the group consisting of oxygen, nitrogen, and fluorine. Thereby, for example, the stability of the operations of the magnetic memory device 110 increases. This is based on the following.

When the select voltage is applied to the first stacked body SB1, for example, the electric field intensity at the outer perimeter portion of the first stacked body SB1 is smaller than the electric field intensity at the central portion of the first stacked body SB1. The first compound region 41 includes the first metal and at least one selected from the group consisting of oxygen, nitrogen, and fluorine. Thereby, the electric field intensity at the outer perimeter portion of the first stacked body SB1 can be increased. The difference between the electric field intensity at the outer perimeter portion of the first stacked body SB1 and the electric field intensity at the central portion of the first stacked body SB1 can be reduced. Similarly, for the second stacked body SB2, the difference between the electric field intensity at the outer perimeter portion of the second stacked body SB2 and the electric field intensity at the central portion of the second stacked body SB2 can be reduced.

Figure 4A:
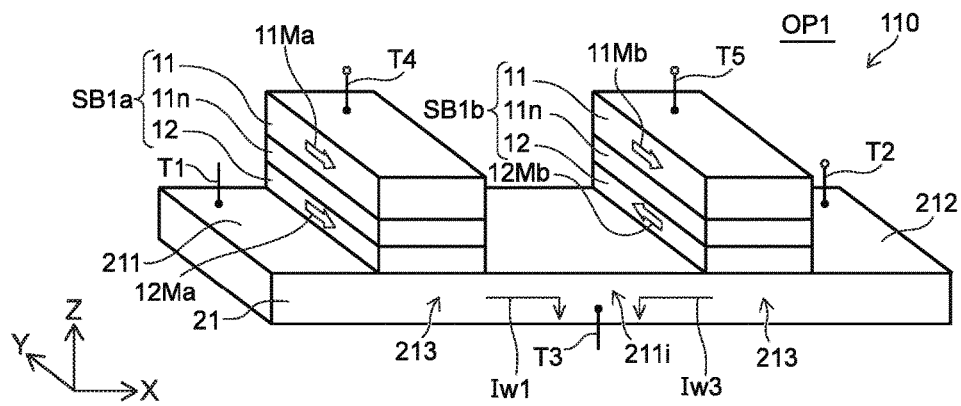
FIG. 4A to FIG. 4C are schematic perspective views illustrating other operations of the magnetic memory device according to the first embodiment.
Figure 4B:
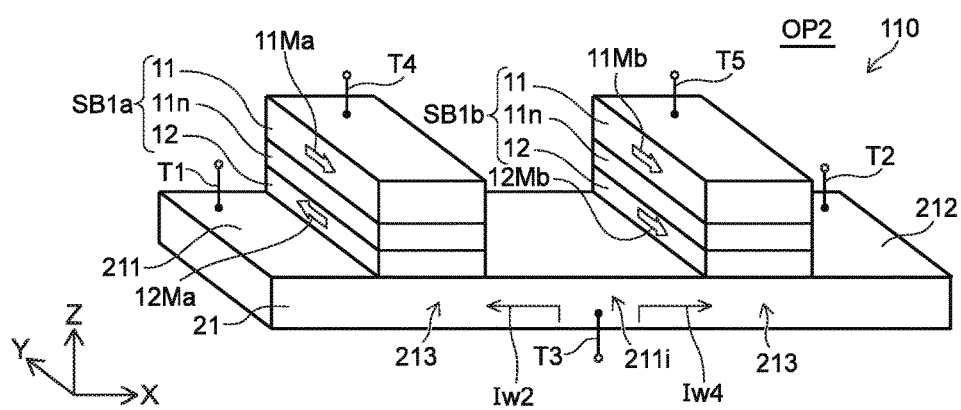
Figure 4C:
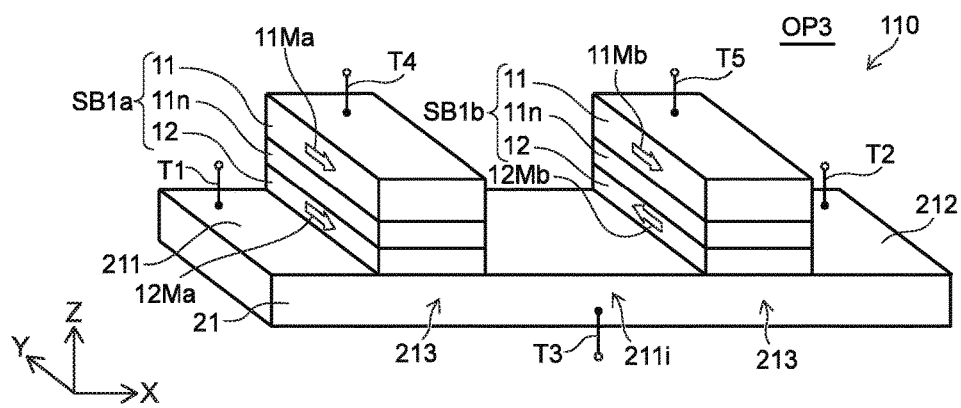

FIG. 4A to FIG. 4C are schematic perspective views illustrating other operations of the magnetic memory device according to the first embodiment.

Multiple stacked bodies (a stacked body SB1a and a stacked body SB1b) are provided as illustrated in FIG. 4A. The stacked body SB1a overlaps one of the multiple third portions 213 in the second direction (the Z-axis direction). The stacked body SB1b overlaps another one of the multiple third portions 213 in the second direction. The first conductive layer 21 includes a first intermediate portion 211i. The first intermediate portion 211i corresponds to a portion between the stacked body SB1a and the stacked body SB1b.

For example, a first terminal T1 is electrically connected to the first portion 211 of the first conductive layer 21. A second terminal T2 is electrically connected to the second portion 212. A third terminal T3 is electrically connected to the first intermediate portion 211i. A fourth terminal T4 is electrically connected to the first magnetic layer 11 of the stacked body SB1a. A fifth terminal T5 is electrically connected to the first magnetic layer 11 of the stacked body SB1b.

In one operation OP1 as shown in FIG. 4A, the first current Iw1 flows from the first terminal T1 toward the third terminal T3; and the third current Iw3 flows from the second terminal T2 toward the third terminal T3. The orientation of the current (the first current Iw1) at the position of the stacked body SB1a is the reverse of the orientation of the current (the third current Iw3) at the position of the stacked body SB1b. In such an operation OP1, the orientation of the spin Hall torque acting on the second magnetic layer 12 of the stacked body SB1a is the reverse of the orientation of the spin Hall torque acting on the second magnetic layer 12 of the stacked body SB1b.

In another operation OP2 shown in FIG. 4B, the second current Iw2 flows from the third terminal T3 toward the first terminal T1; and the fourth current Iw4 flows from the third terminal T3 toward the second terminal T2. The orientation of the current (the second current Iw2) at the position of the stacked body SB1a is the reverse of the orientation of the current (the fourth current Iw4) at the position of the stacked body SB1b. In such an operation OP2, the orientation of the spin Hall torque acting on the second magnetic layer 12 of the stacked body SB1a is the reverse of the orientation of the spin Hall torque acting on the second magnetic layer 12 of the stacked body SB1b.

As shown in FIG. 4A and FIG. 4B, the orientation of a magnetization 12Mb of the second magnetic layer 12 of the stacked body SB1b is the reverse of the orientation of a magnetization 12Ma of the second magnetic layer 12 of the stacked body SB1a. On the other hand, the orientation of a magnetization 11Mb of the first magnetic layer 11 of the stacked body SB1b is the same as the orientation of a magnetization 11Ma of the first magnetic layer 11 of the stacked body SB1a. Thus, magnetization information having reverse orientations between the stacked body SB1a and the stacked body SB1b is stored. For example, the information (the data) of the case of the operation OP1 corresponds to "1." For example, the information (the data) of the case of the operation OP2 corresponds to "0." By such operations, for example, as described below, the reading can be faster.

In the operation OP1 and the operation OP2, an interaction occurs between the magnetization 12Ma and the spin current of the electrons (the polarized electrons) flowing through the first conductive layer 21. The orientation of the magnetization 12Ma and the orientation of the spin of the polarized electrons have a parallel or antiparallel relationship. The magnetization 12Ma precesses and reverses. In the operation OP1 and the operation OP2, the orientation of the magnetization 12Mb and the orientation of the spin of the polarized electrons have a parallel or antiparallel relationship. The magnetization 12Mb precesses and reverses.

FIG. 4C illustrates the read operation of the magnetic memory device 110.

In a read operation OP3, the potential of the fourth terminal T4 is set to a fourth potential V4. The potential of the fifth terminal T5 is set to a fifth potential V5. The fourth potential V4 is, for example, a ground potential. The potential difference between the fourth potential V4 and the fifth potential V5 is taken as ΔV. Two electrical resistances of each of the multiple stacked bodies are taken as a high resistance Rh and a low resistance Rl. The high resistance Rh is higher than the low resistance Rl. For example, the resistance when the magnetization 11Ma and the magnetization 12Ma are antiparallel corresponds to the high resistance Rh. For example, the resistance when the magnetization 11Ma and the magnetization 12Ma are parallel corresponds to the low resistance Rl. For example, the resistance when the magnetization 11Mb and the magnetization 12Mb are antiparallel corresponds to the high resistance Rh. For example, the resistance when the magnetization 11Mb and the magnetization 12Mb are parallel corresponds to the low resistance Rl.

For example, a potential Vr1 of the third terminal T3 in the operation OP1 (the "1" state) illustrated in FIG. 4A is represented by Formula (1).

$$Vr1=(Rl/(Rl+Rh))\times\Delta V \quad (1)$$

Figure 15A:
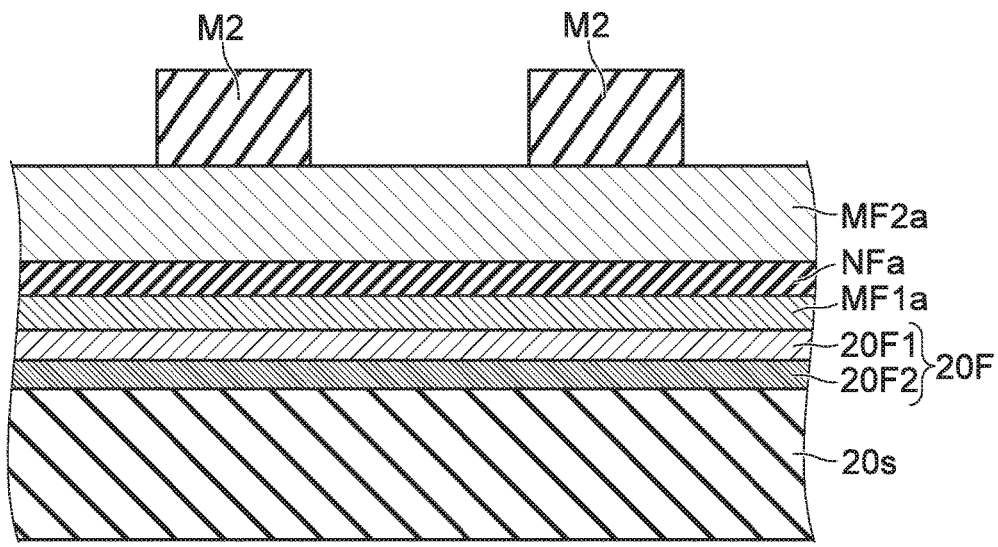
FIGS. 15A and 15B are schematic cross-sectional views illustrating manufacturing processes of another magnetic memory device according to the second embodiment.
Figure 15B:
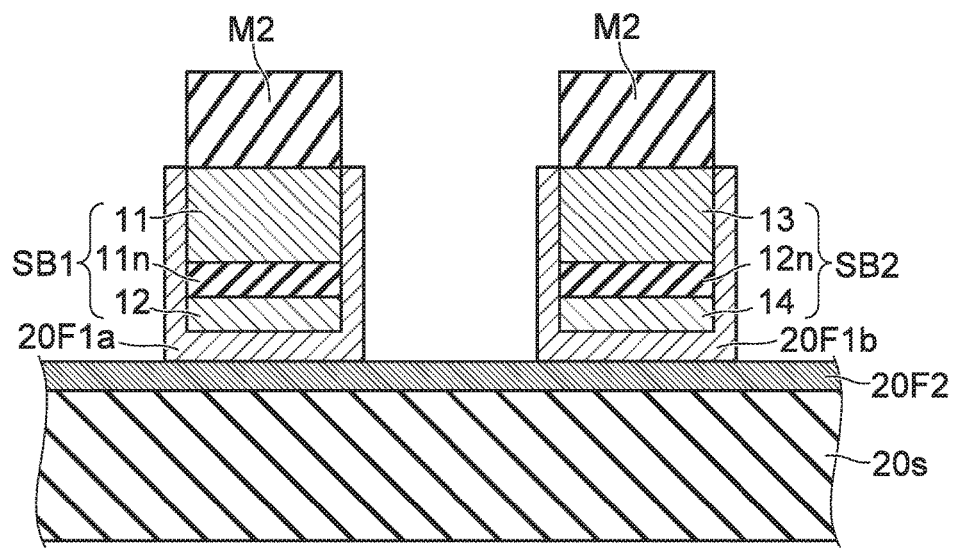

On the other hand, a potential Vr2 of the third terminal T3 in the state of the operation OP2 (the "0" state) illustrated in FIG. 15B is represented by Formula (2).

$$Vr2=(Rh/(Rl+Rh))\times\Delta V \quad (2)$$

Accordingly, a potential change ΔVr between the "1" state and the "0" state is represented by Formula (3).

$$\Delta Vr=Vr2-Vr1=((Rh-Rl)/(Rl+Rh))\times\Delta V \quad (3)$$

The potential change ΔVr is obtained by measuring the potential of the third terminal T3.

Compared to the case where the voltage (the potential difference) between the two magnetic layers of the magnetoresistive element is measured by supplying a constant current to the stacked body (the magnetoresistive element), for example, the consumed energy when reading can be reduced in the read operation OP3 recited above. In the read operation OP3 recited above, for example, high-speed reading can be performed.

By using the fourth terminal T4 and the fifth terminal T5, the perpendicular magnetic anisotropy of each of the multiple second magnetic layers 12 can be controlled in the operation OP1 and the operation OP2 recited above. Thereby, the write current can be reduced. For example, the write current can be about ½ of the write current of the case where the writing is performed without using the fourth terminal T4 and the fifth terminal T5. For example, the write charge can be reduced. The relationship between the increase and decrease of the perpendicular magnetic anisotropy and the polarities of the voltages applied to the fourth terminal T4 and the fifth terminal T5 is dependent on the materials of the magnetic layers and the conductive layers.

In FIG. 4C recited above, the first terminal T1 and the second terminal T2 may be set to the same potential; the fourth terminal T4 and the fifth terminal T5 may be connected to the input terminals of sense amplifiers; and the potential difference between the fourth terminal T4 and the fifth terminal T5 may be read by the sense amplifiers. A voltage may be applied to one of the first terminal T1 or the second terminal T2; and the other of the first terminal T1 or the second terminal T2 may be floating. Or, the same current may be caused to flow in the first terminal T1 and the second terminal T2; and the current difference between the fourth terminal T4 and the fifth terminal T5 may be read. Further, the first terminal T1 and the second terminal T2 may be set to the same potential; the fourth terminal T4 and the fifth terminal T5 may be connected to the input terminals of sense amplifiers; and the potential difference between the fourth terminal T4 and the fifth terminal T5 may be read by the sense amplifiers. The fourth terminal T4 and the fifth terminal T5 may be set to the same potential; the first terminal T1 and the second terminal T2 may be connected to the input terminals of sense amplifiers; and the potential difference between the first terminal T1 and the second terminal T2 may be read by the sense amplifiers.

FIG. 5A to FIG. 7B are schematic perspective views illustrating a manufacturing process of the magnetic memory device according to the first embodiment.

Figure 5A:
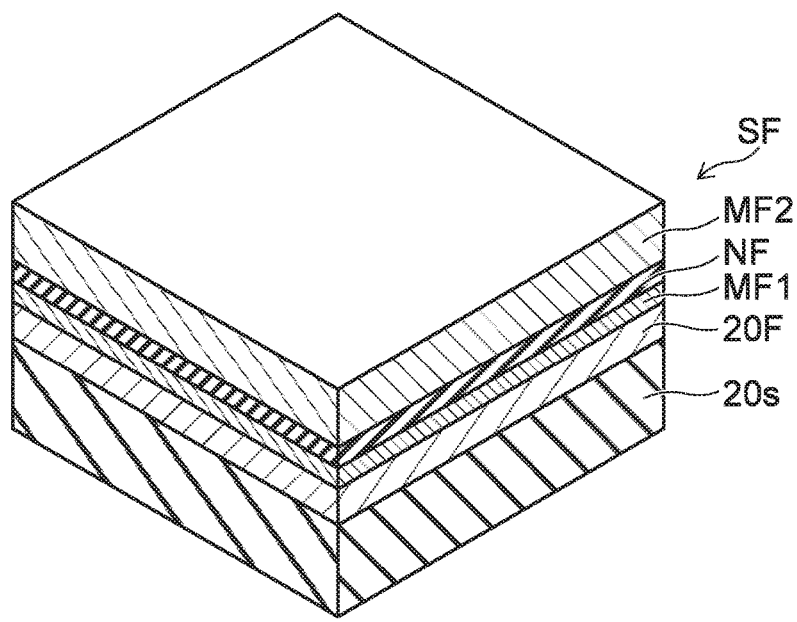
FIG. 5A to FIG. 7B are schematic perspective views illustrating a manufacturing process of the magnetic memory device according to the first embodiment.

A conductive film 20F is formed on the base body 20s. A magnetic film MF1 is formed on the conductive film 20F. A nonmagnetic film NF is formed on the magnetic film MF1. A magnetic film MF2 is formed on the nonmagnetic film NF. Thereby, a stacked film SF illustrated in FIG. 5A is formed.

The conductive film 20F includes, for example, at least one first metal selected from the group consisting of Hf, Ta, W, PtRe, Os, Ir, Pt, Pd, Cu, Ag, and Au. The magnetic films MF1 and MF2 include, for example, at least one first element selected from the group consisting of Fe, Co, and Ni. The nonmagnetic film NF includes, for example, at least one selected from the group consisting of MgO, CaO, SrO, TiO, VO, NbO, and $Al_2O_3$.

Multiple masks M1 are formed on the stacked film SF. The multiple masks M1 are separated from each other. Each of the masks M1 has a band configuration and extends in the Y-direction. The stacked film SF is exposed in the openings of the masks M1.

Figure 5B:
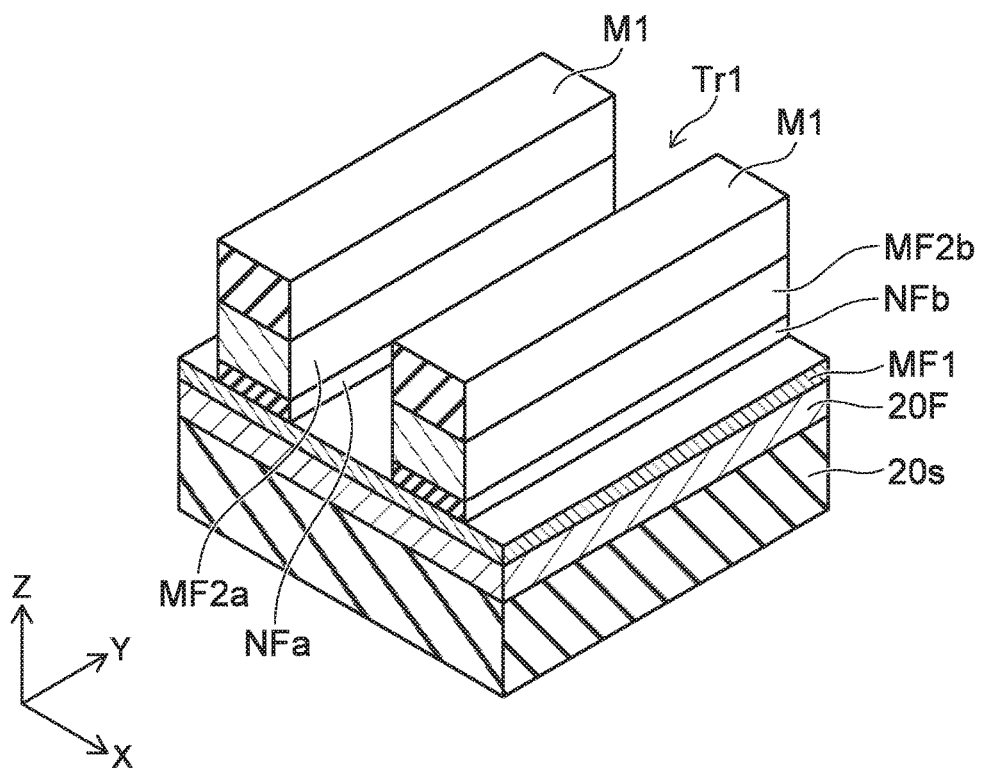

Trenches Tr1 are formed as illustrated in FIG. 5B by removing a portion of the magnetic film MF2 and a portion of the nonmagnetic film NF. For example, the removal process is performed by the irradiation of an ion beam including Ar. For example, the trenches Tr1 do not pierce through the magnetic film MF1. By forming the trenches Tr1, the nonmagnetic film NF is separated into a nonmagnetic film NFa and a nonmagnetic film NFb. The magnetic film MF2 is separated into a magnetic film MF2a and a magnetic film MF2b.

Figure 6A:
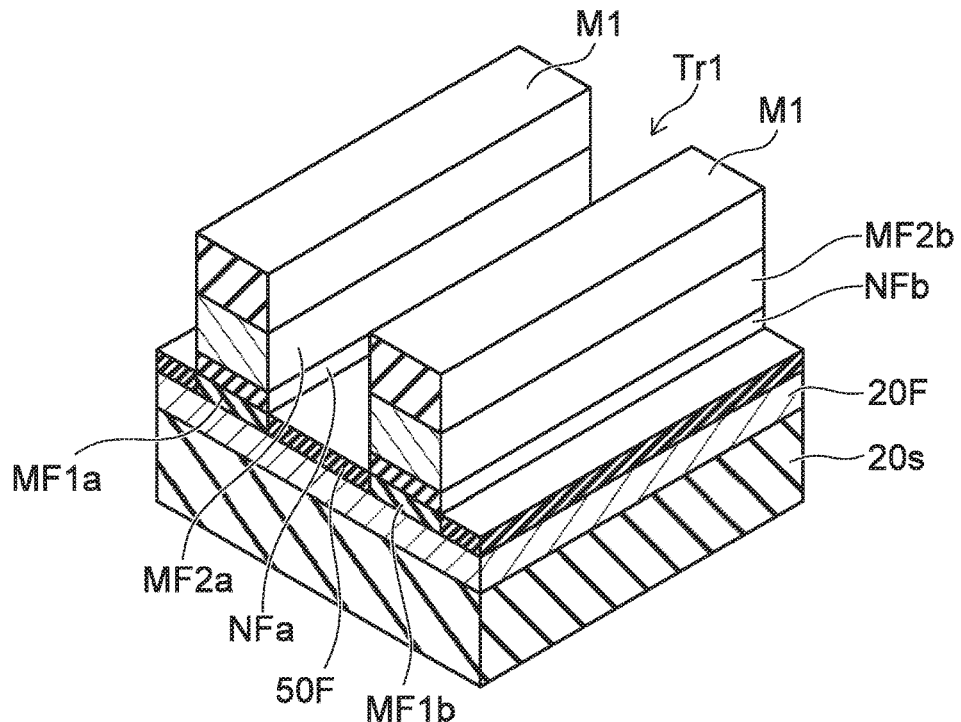

A portion of the magnetic film MF1 is exposed via the trenches Tr1. A portion of the exposed magnetic film MF1 is oxidized. Thereby, an insulating film 50F is formed as illustrated in FIG. 6A. For example, the insulating film 50F is formed by exposing the portion of the magnetic film MF1 recited above to oxygen plasma or by irradiating an oxygen beam on the portion of the magnetic film MF1 recited above. By forming the insulating film 50F, the magnetic film MF1 is separated into a magnetic film MF1a and a magnetic film MF1b.

Figure 6B:
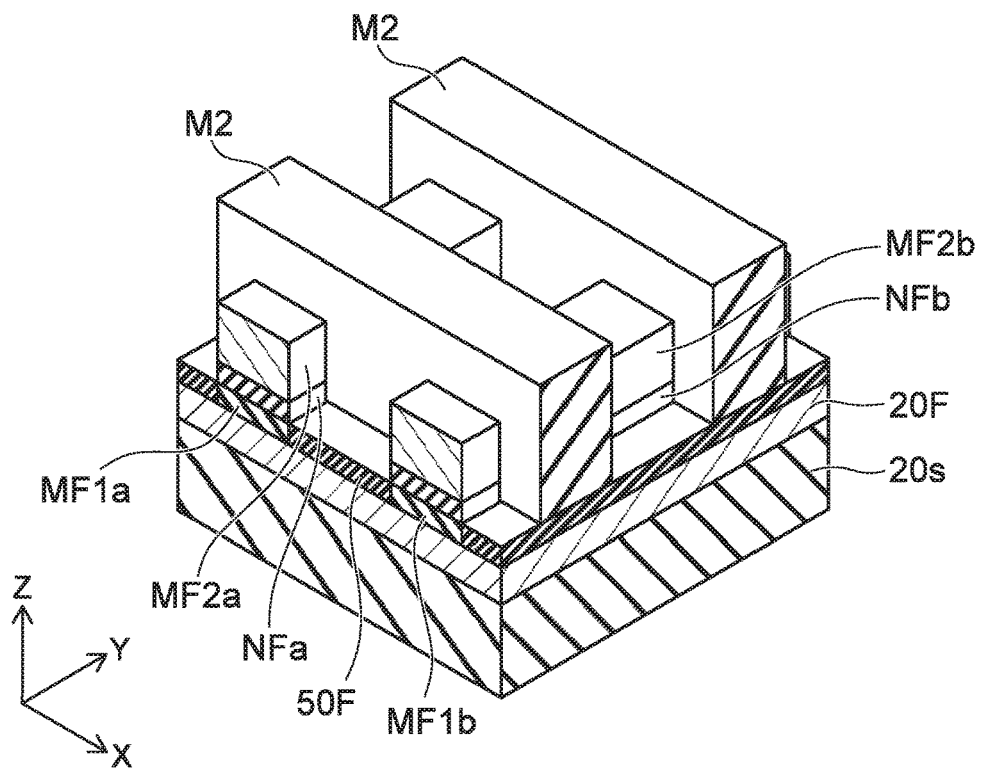

Multiple masks M2 are formed as illustrated in FIG. 6B. The multiple masks M2 are separated from each other. Each of the masks M2 has a band configuration and extends in the X-direction. Portions of the magnetic film MF2a, the magnetic film MF2b, and the insulating film 50F are exposed via the openings of the masks M2.

Figure 7A:
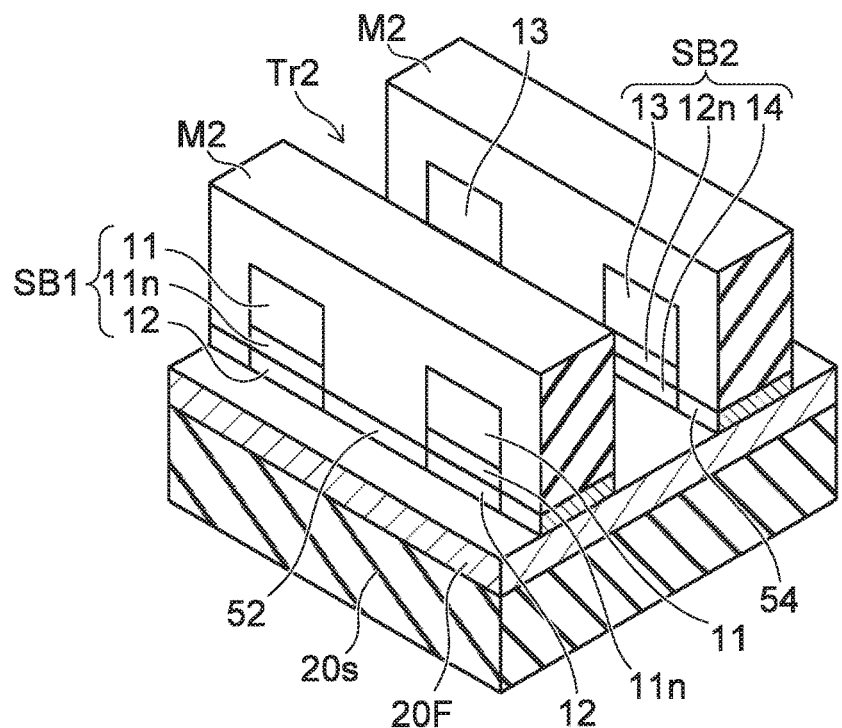

Portions of the magnetic film MF2a, the magnetic film MF2b, the nonmagnetic film NFa, the nonmagnetic film NFb, the magnetic film MF1a, the magnetic film MF1b, and the insulating film 50F are removed via the openings of the multiple masks M2. Thereby, multiple trenches Tr2 are formed as illustrated in FIG. 7A. For example, the removal process is performed by the irradiation of an ion beam including Ar. A portion of the conductive film 20F is exposed via the trenches Tr2. The trenches Tr2 do not pierce through the conductive film 20F.

By this process, the magnetic film MF2a and the magnetic film MF2b are separated into the multiple first magnetic layers 11 and the multiple third magnetic layers 13. The nonmagnetic film NFa and the nonmagnetic film NFb are separated into the multiple first nonmagnetic layers 11n and the multiple second nonmagnetic layers 12n. The magnetic film MF1a and the magnetic film MF1b are separated into the multiple second magnetic layers 12 and the multiple fourth magnetic layers 14. The insulating film 50F is separated into an insulating region 52 and an insulating region 54.

Figure 7B:
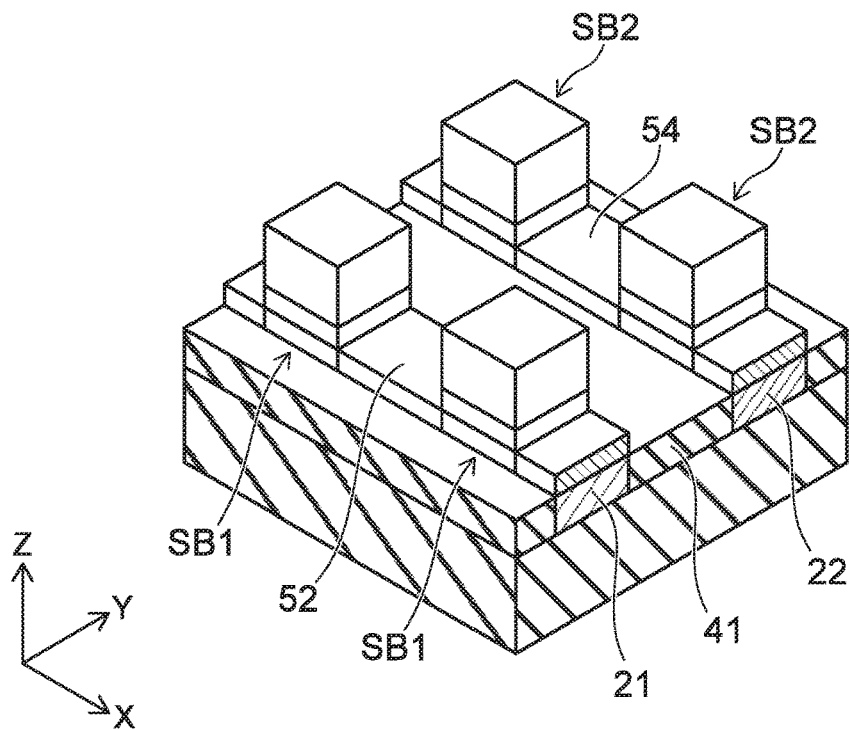

The first compound region 41 that includes the first metal and oxygen is formed as illustrated in FIG. 7B by oxidizing a portion of the exposed conductive film 20F. The formation of the first compound region 41 is performed by exposing the portion of the conductive film 20F to oxygen plasma or by irradiating an oxygen beam on the portion of the conductive film 20F. By forming the first compound region 41, the conductive film 20F is separated into the first conductive layer 21 and the second conductive layer 22.

For example, the volume increases when the portion of the conductive film 20F changes into the first compound region 41. Thereby, for example, a portion of the first compound region 41 is positioned between the second magnetic layer 12 and the fourth magnetic layer 14, between the first nonmagnetic layer 11n and the second nonmagnetic layer 12n, and between a portion of the first magnetic layer 11 and a portion of the third magnetic layer 13 in the Y-axis direction.

An insulating film is formed on the multiple first stacked bodies SB1, the multiple second stacked bodies SB2, the first compound region 41, the insulating region 52, and the insulating region 54. The insulating film includes, for example, at least one selected from the group consisting of Al and Si and at least one selected from the group consisting of oxygen, nitrogen, and fluorine. A portion of the insulating film corresponds to the first insulating region 51. Another portion of the insulating film corresponds to the insulating region 53 and the insulating region 55.

FIG. 8A to FIG. 11B are schematic cross-sectional views illustrating other magnetic memory devices according to the first embodiment.

In a magnetic memory device 120 illustrated in FIG. 8A, the first compound region 41 is provided between the first conductive layer 21 and the second conductive layer 22 and between the second magnetic layer 12 and the fourth magnetic layer 14 in the Y-axis direction. In the example, another portion of the first compound region 41 is provided between the first nonmagnetic layer 11n and the second nonmagnetic layer 12n in the Y-axis direction. For example, the first compound region 41 physically contacts the first conductive layer 21, the second magnetic layer 12, the first nonmagnetic layer 11n, the second conductive layer 22, the fourth magnetic layer 14, and the second nonmagnetic layer 12n.

In a magnetic memory device 121 illustrated in FIG. 8B, a portion of the first compound region 41 is provided between the first conductive layer 21 and the second conductive layer 22, between the second magnetic layer 12 and the fourth magnetic layer 14, and between the first nonmagnetic layer 11n and the second nonmagnetic layer 12n in the Y-axis direction. Another portion of the first compound region 41 is provided between a portion of the first magnetic layer 11 and a portion of the third magnetic layer 13 in the Y-axis direction. Thereby, the electric field intensity at the first compound region 41 vicinity of the first nonmagnetic layer 11n and the second nonmagnetic layer 12n can be increased further. For example, the stability of the operations of the magnetic memory device 121 improves further. For example, the first compound region 41 physically contacts the first conductive layer 21, the second magnetic layer 12, the first nonmagnetic layer 11n, the first magnetic layer 11, the second conductive layer 22, the fourth magnetic layer 14, the second nonmagnetic layer 12n, and the third magnetic layer 13.

In a magnetic memory device 122 illustrated in FIG. 8C, the first compound region 41 is provided between a portion of the first conductive layer 21 and a portion of the second conductive layer 22 in the Y-axis direction. A portion of the first insulating region 51 is provided between another portion of the first conductive layer 21 and another portion of the second conductive layer 22 in the Y-axis direction.

Figure 9:
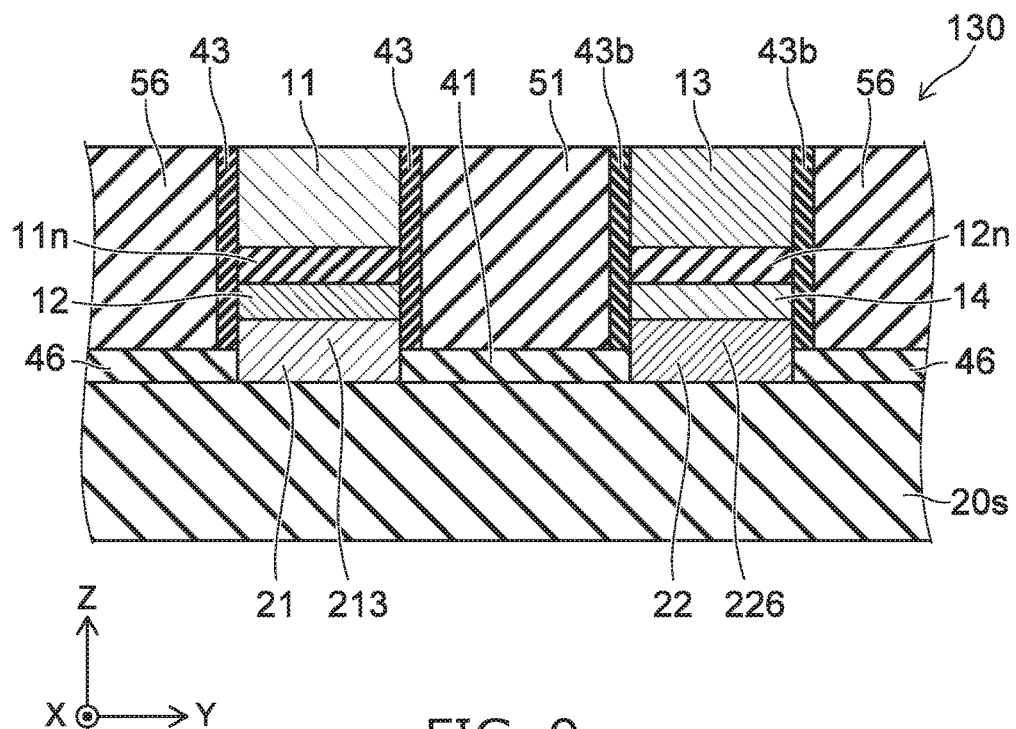

A magnetic memory device 130 illustrated in FIG. 9 further includes multiple third compound regions 43 and multiple compound regions 43b.

The multiple third compound regions 43 are separated from each other in the Y-axis direction. A portion of the first stacked body SB1 is provided between the third compound regions 43 in the Y-axis direction. One of the multiple third compound regions 43 is provided between the first insulating region 51 and a portion of the first stacked body SB1 in the Y-axis direction.

In the example, one of the multiple third compound regions 43 is provided between the first insulating region 51 and a portion of the first conductive layer 21, between the second magnetic layer 12 and the first insulating region 51, between the first nonmagnetic layer 11n and the first insulating region 51, and between the first magnetic layer 11 and the first insulating region 51 in the Y-axis direction.

The multiple compound regions 43b are separated from each other in the Y-axis direction. A portion of the second stacked body SB2 is provided between the compound regions 43b in the Y-axis direction. One of the multiple compound regions 43b is provided between the first insulating region 51 and a portion of the second stacked body SB2 in the Y-axis direction.

In the example, one of the multiple compound regions 43b is provided between the first insulating region 51 and a portion of the second conductive layer 22, between the fourth magnetic layer 14 and the first insulating region 51, between the second nonmagnetic layer 12n and the first insulating region 51, and between the third magnetic layer 13 and the first insulating region 51 in the Y-axis direction.

The multiple third compound regions 43 and the multiple compound regions 43b include the first metal and at least one selected from the group consisting of oxygen, nitrogen, and fluorine.

Figure 10:
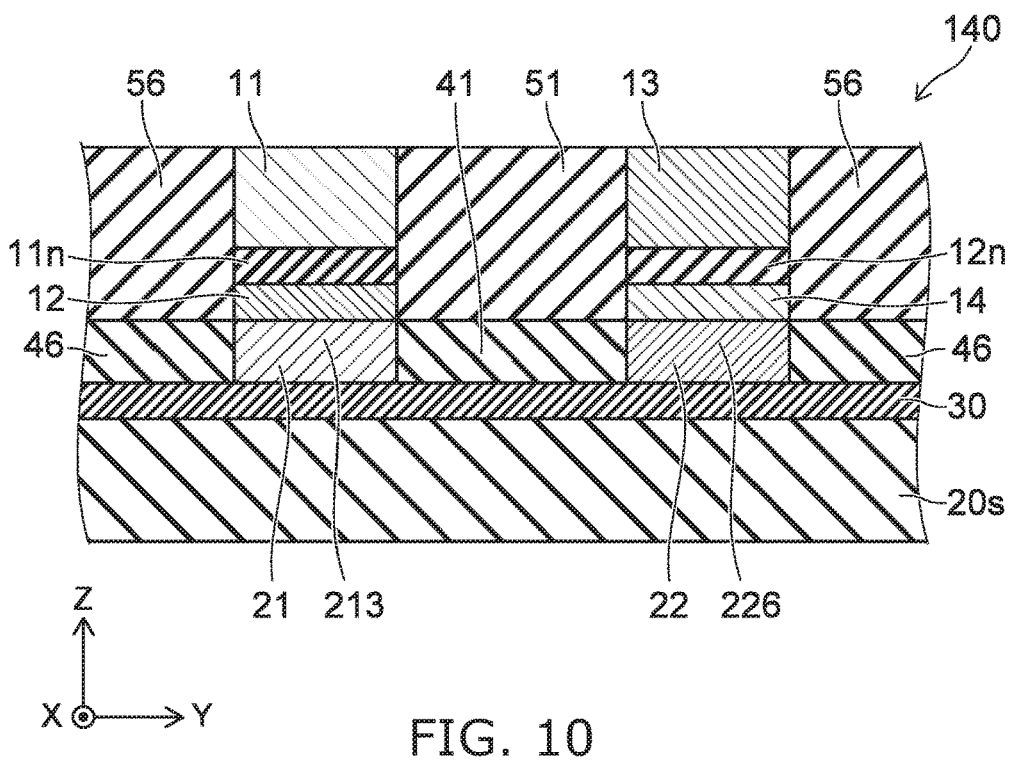

A magnetic memory device 140 illustrated in FIG. 10 further includes a first compound layer 30.

For example, the first compound layer 30 overlaps the first conductive layer 21, the second conductive layer 22, the first compound region 41, and the multiple compound regions 46 in the Z-axis direction. The first conductive layer 21 is provided between the second magnetic layer 12 and a portion of the first compound layer 30 in the Z-axis direction. The second conductive layer 22 is provided between the fourth magnetic layer 14 and another portion of the first compound layer 30 in the Z-axis direction.

The first compound layer 30 includes, for example, an insulative compound. In such a case, the first compound layer 30 includes, for example, oxygen and at least one element selected from the group consisting of aluminum, magnesium, tantalum, boron, calcium, silicon, germanium, gallium, indium, tungsten, titanium, copper, palladium, and zirconium. For example, the element is different from the first metal. The element may be the same as the first metal.

Figure 11A:
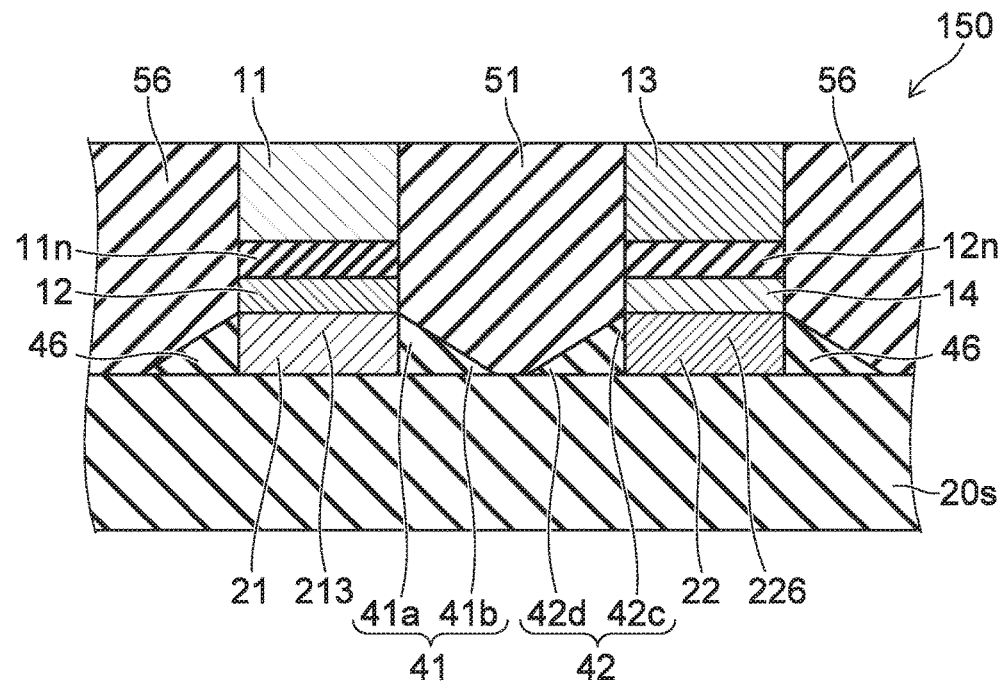

A magnetic memory device 150 illustrated in FIG. 11A further includes a second compound region 42. At least a portion of the first compound region 41 and at least a portion of the second compound region 42 are provided between at least a portion of the first conductive layer 21 and at least a portion of the second conductive layer 22 in the Y-axis direction.

The first compound region 41 and the second compound region 42 are separated from each other in the Y-axis direction. For example, a portion of the first insulating region 51 is provided between the first compound region 41 and the second compound region 42 in the Y-axis direction.

The first compound region 41 includes a first partial region 41a and a second partial region 41b. The second compound region 42 includes a third partial region 42c and a fourth partial region 42d. The second partial region 41b is provided between the first partial region 41a and the fourth partial region 42d in the Y-axis direction. The fourth partial region 42d is provided between the second partial region 41b and the third partial region 42c.

The thickness (the length in the Z-axis direction) of the second partial region 41b is thinner than the thickness of the first partial region 41a and thinner than the thickness of the third partial region 42c. The thickness of the fourth partial region 42d is thinner than the thickness of the first partial region 41a and thinner than the thickness of the third partial region 42c.

Figure 11B:
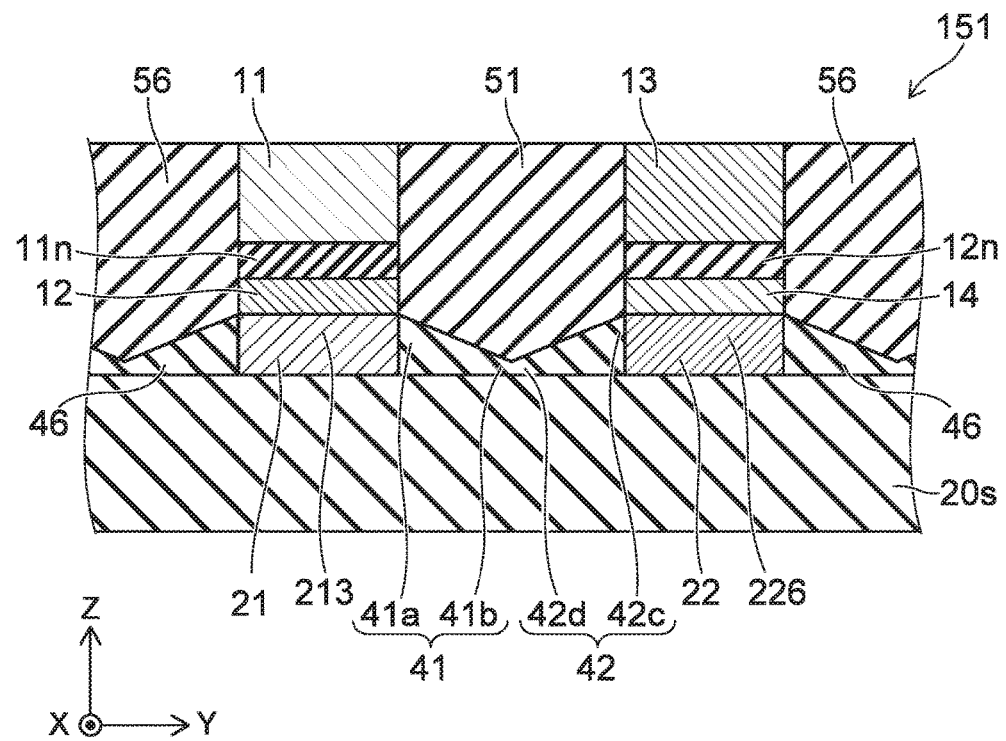

In the magnetic memory device 151 illustrated in FIG. 11B, the first compound region 41 and the second compound region 42 are linked to each other. For example, a portion of the first insulating region 51 is provided between a portion of the first compound region 41 and a portion of the second compound region 42 in the Y-axis direction.

The thickness of the second partial region 41b is, for example, not more than 0.1 times the thickness of the first partial region 41a. The thickness of the fourth partial region 42d is, for example, not more than 0.1 times the thickness of the third partial region 42c.

Figure 12A:
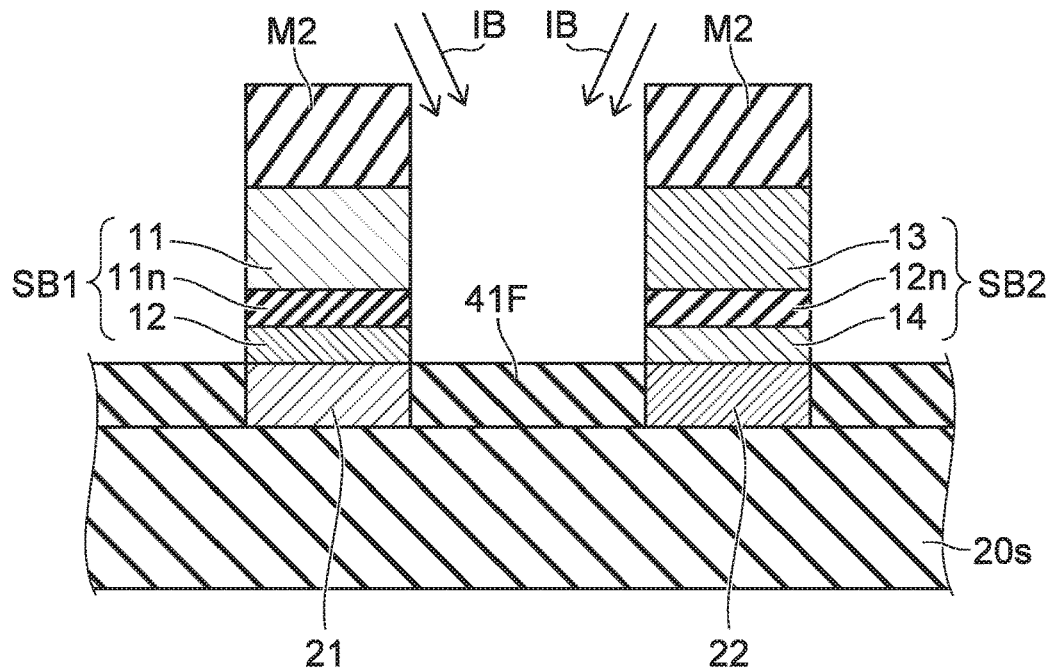
FIGS. 12A and 12B are schematic cross-sectional views illustrating manufacturing processes of another magnetic memory device according to the first embodiment.
Figure 12B:
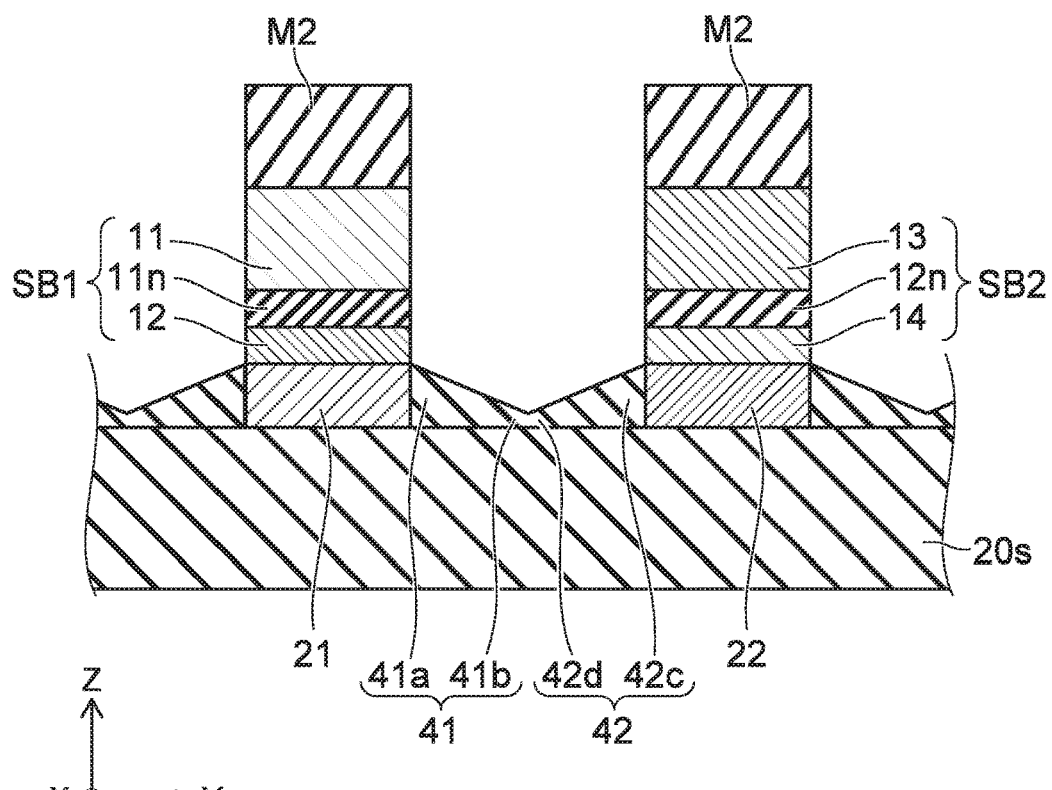

FIGS. 12A and 12B are schematic cross-sectional views illustrating manufacturing processes of another magnetic memory device according to the first embodiment.

The state illustrated in FIG. 12A corresponds to a state after oxidizing a portion of the conductive film 20F after the state illustrated in FIG. 7A.

A compound film 41F is formed by oxidizing the portion of the conductive film 20F. A portion of the compound film 41F is removed. For example, the removal process is performed by irradiating, on the compound film 41F, an ion beam IB including Ar. In this process, the ion beam IB is irradiated on the compound film 41F by being tilted from the Z-axis direction. A portion of the ion beam IB is shielded by the first stacked body SB1, the second stacked body SB2, and the multiple masks M2. Thereby, as illustrated in FIG. 12B, the first compound region 41 that includes the first partial region 41a and the second partial region 41b is formed; and the second compound region that includes the third partial region 42c and the fourth partial region 42d is formed. The compound film 41F may be separated by removing a portion of the compound film 41F. In such a case, the first compound region 41 and the second compound region 42 that are separated from each other are formed.

Figure 13:
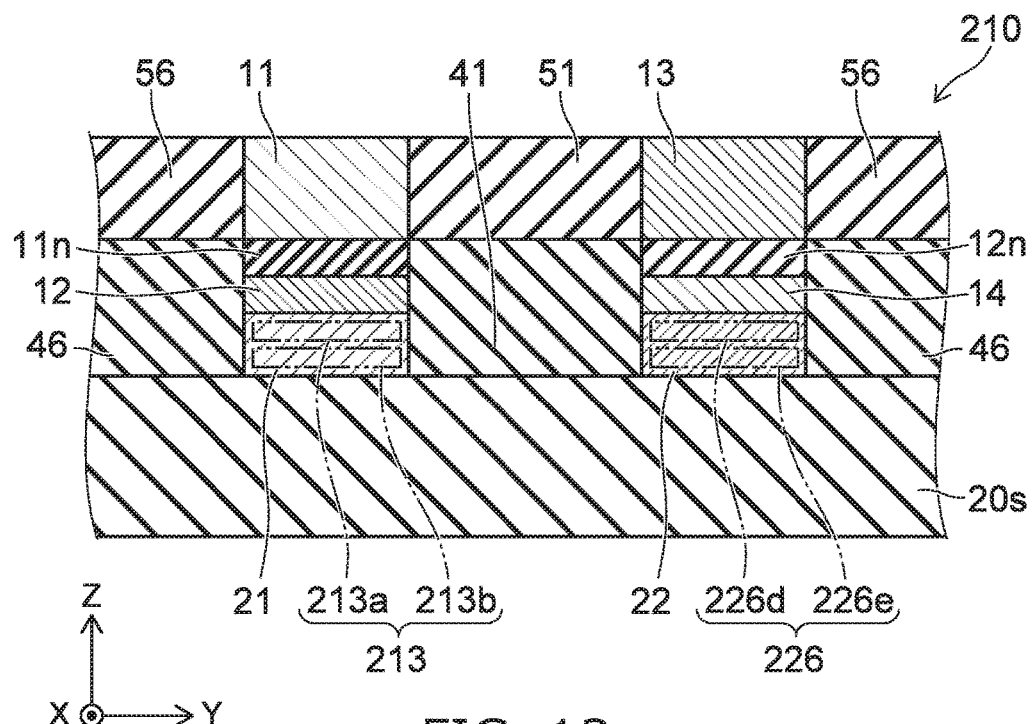
FIG. 13 is a schematic cross-sectional view illustrating a magnetic memory device according to a second embodiment.

FIG. 13 is a schematic cross-sectional view illustrating a magnetic memory device according to a second embodiment.

In the magnetic memory device 210 according to the second embodiment, the third portion 213 of the first conductive layer 21 includes a first conductive region 213a and a second conductive region 213b. The first conductive region 213a is provided between the second magnetic layer 12 and the second conductive region 213b in the Z-axis direction.

The first conductive region 213a includes the first metal. The second conductive region 213b includes a second metal. The first metal is different from the second metal.

The sixth portion 226 of the second conductive layer 22 includes a fourth conductive region 226d and a fifth conductive region 226e. The fourth conductive region 226d is provided between the fourth magnetic layer 14 and the fifth conductive region 226e in the Z-axis direction. The fourth conductive region 226d includes the first metal. The fifth conductive region 226e includes the second metal.

The first compound region 41 includes the second metal and at least one selected from the group consisting of oxygen, nitrogen, and fluorine. The first compound region 41 is provided between the second conductive region 213b and the fifth conductive region 226e in the Y-axis direction. In the example, the first compound region 41 is further provided between the first conductive region 213a and the fourth conductive region 226d, between the second magnetic layer 12 and the fourth magnetic layer 14, and between the first nonmagnetic layer 11n and the second nonmagnetic layer 12n.

The first metal is at least one selected from the group consisting of Ta, Pt, Au, W, Rh, Ir, Re, Ru, Cu, Hf, and Pd. The second metal is at least one selected from the group consisting of Hf, Zr, Ti, Nb, V, and Al. Thereby, for example, the adhesion between the base body 20s and the first conductive layer 21 and the adhesion between the base body 20s and the second conductive layer 22 can be improved. For example, the spin scattering of the first conductive layer 21 and the second conductive layer 22 can be large.

FIG. 14 FIG. 16, FIG. 17A, and FIG. 17B are schematic cross-sectional views illustrating other magnetic memory devices according to the second embodiment.

Figure 14:
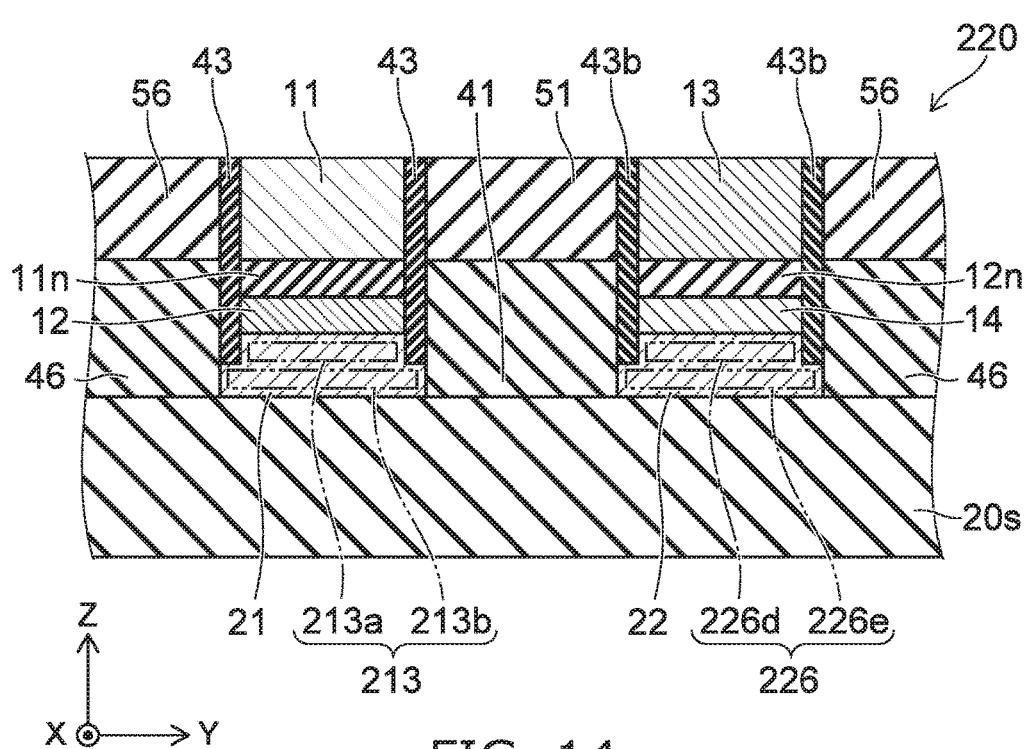
FIG. 14 is a schematic cross-sectional view illustrating another magnetic memory device according to the second embodiment.

The magnetic memory device 220 illustrated in FIG. 14 further includes the multiple third compound regions 43 and the multiple compound regions 43b.

The multiple third compound regions 43 are separated from each other in the Y-axis direction. At least a portion of the first conductive region 213a is provided between the third compound regions 43 in the Y-axis direction.

The multiple compound regions 43b are separated from each other in the Y-axis direction. At least a portion of the fourth conductive region 226d is provided between the compound regions 43b in the Y-axis direction.

One of the multiple third compound regions 43 is provided between the first compound region 41 and the first conductive region 213a in the Y-axis direction. In the example, a portion of the one of the multiple third compound regions 43 recited above is provided between the first compound region 41 and the second magnetic layer 12 and between the first compound region 41 and the first nonmagnetic layer 11n in the Y-axis direction.

One of the multiple compound regions 43b is provided between the first compound region 41 and the fourth conductive region 226d in the Y-axis direction. In the example, a portion of the one of the multiple compound regions 43b recited above is provided between the first compound region 41 and the fourth magnetic layer 14 and between the first compound region 41 and the second nonmagnetic layer 12n in the Y-axis direction.

For example, at least a portion of the first insulating region 51 is provided between the one of the multiple third compound regions 43 recited above and the one of the multiple compound regions 43b recited above in the Y-axis direction.

The multiple third compound regions 43 and the multiple compound regions 43b include the first metal and at least one selected from the group consisting of oxygen, nitrogen, and fluorine. Thereby, the stability of the operations of the magnetic memory device 110 increases. For example, this is based on the decrease of the difference between the electric field intensity at the outer perimeter portion of the first stacked body SB1 and the electric field intensity at the central portion of the first stacked body SB1. For example, this is based on the decrease of the difference between the electric field intensity at the outer perimeter portion of the second stacked body SB2 and the electric field intensity at the central portion of the second stacked body SB2.

FIGS. 15A and 15B are schematic cross-sectional views illustrating manufacturing processes of another magnetic memory device according to the second embodiment.

The state illustrated in FIG. 15A corresponds to the state illustrated in FIG. 6B. In the example, the conductive film 20F includes a first conductive film 20F1 and a second conductive film 20F2. The first conductive film 20F1 includes the first metal. The second conductive film 20F2 includes the second metal.

Portions of the magnetic film MF2a, the nonmagnetic film NFa, the magnetic film MF1a, and the first conductive film 20F1 are removed. For example, the removal process is performed by the irradiation of an ion beam including Ar. Thereby, the first stacked body SB1 and the second stacked body SB2 are formed. The first conductive film 20F1 is separated into a conductive film 20F1a and a conductive film 20F1b.

When removing the portion of the first conductive film 20F1, a portion of the removed material adheres to the side walls of the first stacked body SB1 and the second stacked body SB2 as illustrated in FIG. 15B. In this state, a portion of the second conductive film 20F2 and the metal material adhered to the side wall of the first stacked body SB1 and the side wall of the second stacked body SB2 are oxidized. Thereby, the multiple third compound regions 43, the multiple compound regions 43b, and the first compound region 41 illustrated in FIG. 14 are formed.

Figure 16:
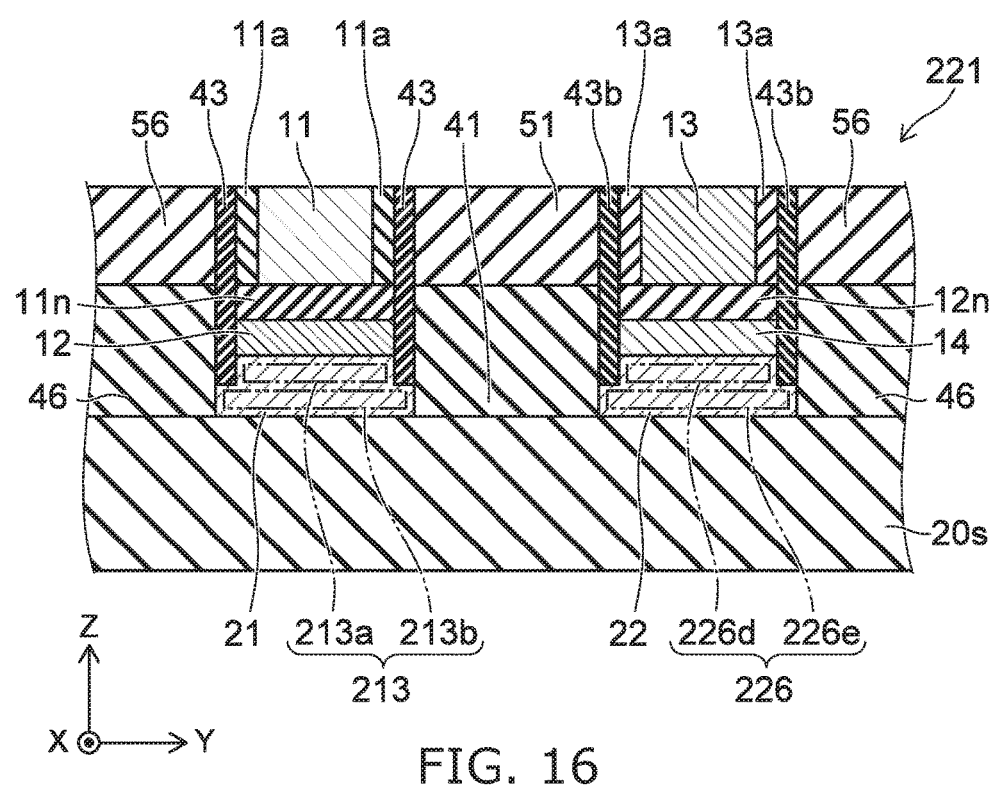
FIG. 16 to FIG. 19 are schematic cross-sectional views illustrating other magnetic memory devices according to the second embodiment.

As in a magnetic storage device 221 shown in FIG. 16, the layer 11a may be provided between the first magnetic layer 11 and the third compound region 43. The layer 11a contains, for example, at least one first element selected from the group consisting of Fe, Co and Ni. The layer 11a may contain the first element and oxygen.

A layer 13a may be provided between the third magnetic layer 13 and the compound region 43b. The layer 13a contains, for example, the first element. The layer 13a may contain the first element and oxygen.

After the step shown in FIG. 15A, when removing the magnetic film MF2a, a part of the removed material may adhere to the side walls of the first magnetic layer 11 and the third magnetic layer 13. Thereafter, the layer 11a and the layer 13a can be formed by oxidizing the adhered material.

Figure 17A:
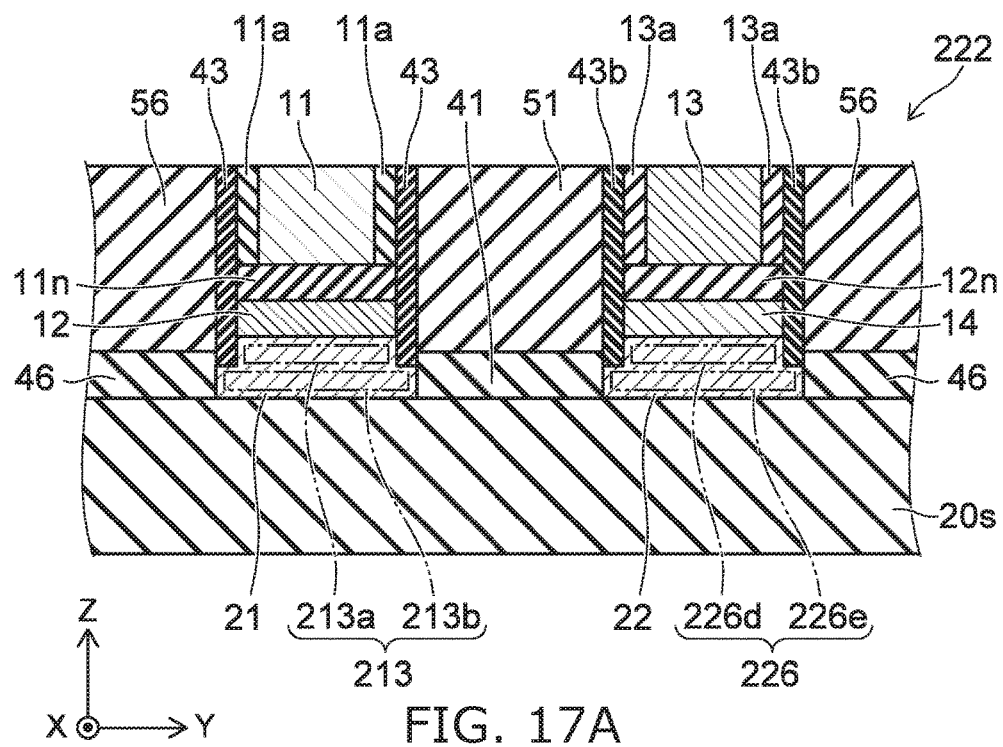

In A magnetic storage device 222 shown in FIG. 17A, the third compound region 43 may be provided between the layer 11a and the first insulating region 51, between the first nonmagnetic layer 11n and the first insulating region 51, and between the second magnetic layer 12 and the first insulating region 51 in the X-axis direction. A part of the third compound region 43 may be provided between the first conductive region 213a and the first insulating region 51 in the X-axis direction.

Figure 17B:
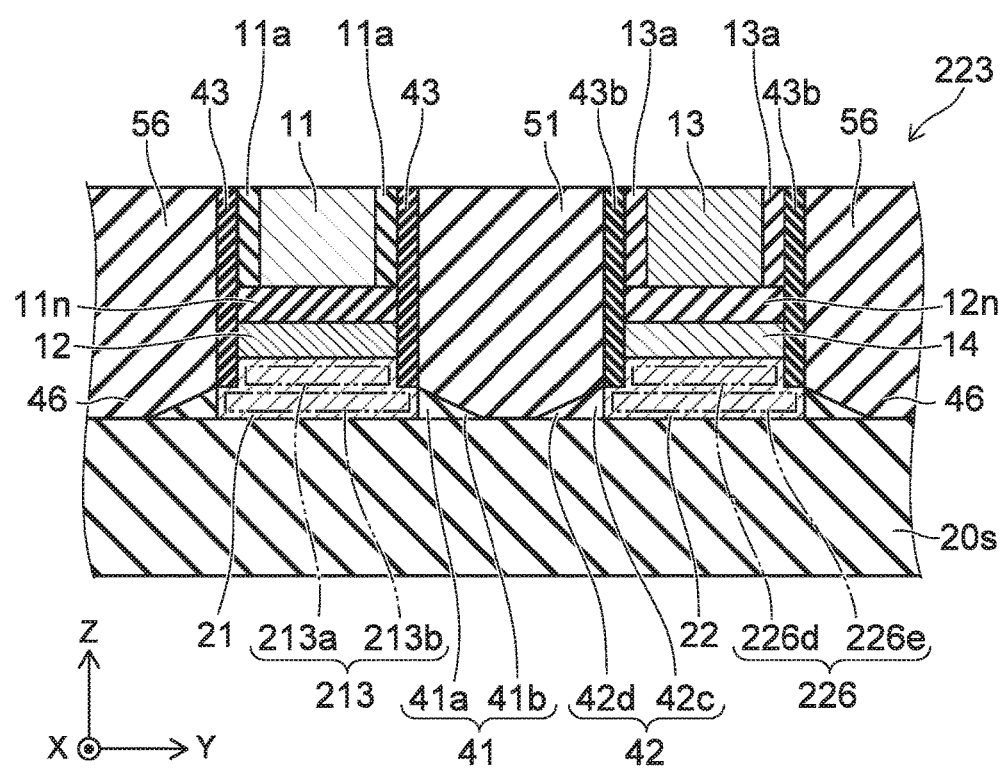

A magnetic storage device 223 shown in FIG. 17B include a first compound region 41 and a second compound region 42. The first compound region 41 includes a first partial region 41a and a second partial region 41b. The second compound region 42 includes a third partial region 42c and a fourth partial region 42d. The second partial region 41b is provided between the first partial region 41a and the fourth partial region 42d in the Y-axis direction. The fourth partial region 42d is provided between the second partial region 41b and the third partial region 42c.

The thickness (the length in the Z-axis direction) of the second partial region 41b is thinner than the thickness of the first partial region 41a and thinner than the thickness of the third partial region 42c. The thickness of the fourth partial region 42d is thinner than the thickness of the first partial region 41a and thinner than the thickness of the third partial region 42c.

The first conductive region 213a and the fourth conductive region 226d include the first metal. The second conductive region 213b and the fifth conductive region 226e include the second metal. The first metal is different from the second metal. The first compound region 41 and the second compound region 42 include the second metal and at least one selected from the group consisting of oxygen, nitrogen, and fluorine.

The first compound region 41 and the second compound region 42 may be linked to each other. For example, a portion of the first insulating region 51 is provided between a portion of the first compound region 41 and a portion of the second compound region 42 in the Y-axis direction.

Figure 18:
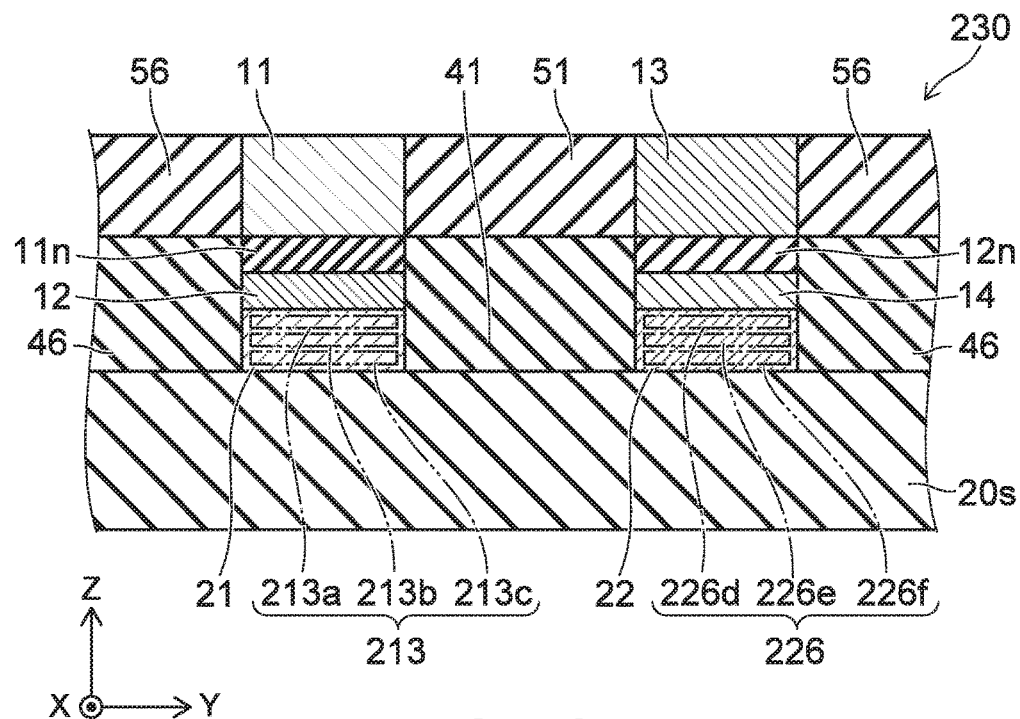
Figure 19:
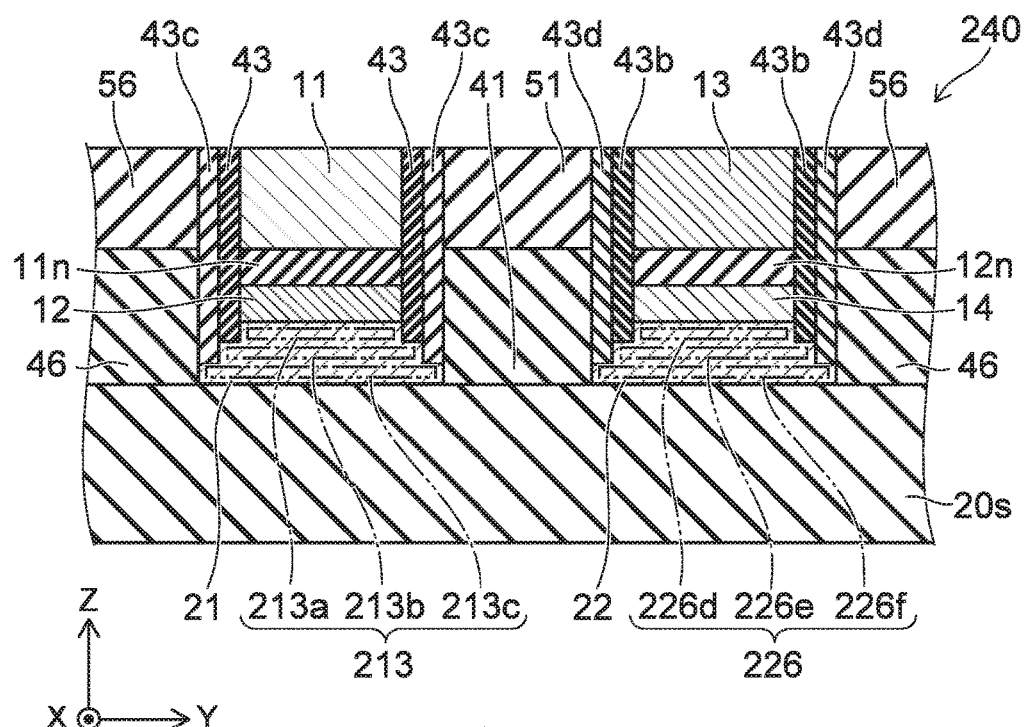

FIG. 18 and FIG. 19 are schematic cross-sectional views illustrating other magnetic memory devices according to the second embodiment.

In the magnetic memory device 230 illustrated in FIG. 17, the third portion 213 of the first conductive layer 21 further includes a third conductive region 213c. The sixth portion 226 of the second conductive layer 22 further includes a sixth conductive region 226f.

The first conductive region 213a and the second conductive region 213b are provided between the third conductive region 213c and the second magnetic layer 12 in the Z-axis direction. The first conductive region 213a includes the first metal selected from the group consisting of Ta, Pt, Au, W, Rh, Ir, Re, Ru, Cu, Hf, and Pd. The second conductive region 213b includes the second metal selected from the group consisting of Hf, Zr, Ti, Nb, V, and Al. The third conductive region 213c includes the third metal selected from the group consisting of Al, Cu, and Sc. The first metal, the second metal, and the third metal are different from each other.

The fourth conductive region 226d and the fifth conductive region 226e are provided between the sixth conductive region 226f and the fourth magnetic layer 14 in the Z-axis direction. The fourth conductive region 226d includes the first metal. The fifth conductive region 226e includes the second metal. The sixth conductive region 226f includes the third metal.

The first compound region 41 includes the third metal and at least one selected from the group consisting of oxygen, nitrogen, and fluorine. At least a portion of the first compound region 41 is provided between the third conductive region 213c and the sixth conductive region 226f in the Y-axis direction. In the example, the first compound region 41 is further provided between the second conductive region 213b and the fifth conductive region 226e, between the first conductive region 213a and the fourth conductive region 226d, and between the second magnetic layer 12 and the fourth magnetic layer 14 in the Y-axis direction.

A magnetic memory device 240 illustrated in FIG. 18 further includes the multiple third compound regions 43, the multiple compound regions 43b, multiple compound regions 43c, and multiple compound regions 43d.

The multiple compound regions 43c are separated from each other in the Y-axis direction. The multiple third compound regions 43 and at least a portion of the second conductive region 213b are provided between the compound regions 43c in the Y-axis direction. One of the multiple compound regions 43c is provided between the second conductive region 213b and a portion of the first compound region 41 in the Y-axis direction. A portion of the one of the multiple compound regions 43c may be provided between at least a portion of one of the multiple third compound regions 43 and a portion of the first compound region 41 in the Y-axis direction.

The multiple compound regions 43d are separated from each other in the Y-axis direction. The multiple compound regions 43b and at least a portion of the fifth conductive region 226e are provided between the compound regions 43d in the Y-axis direction. One of the multiple compound regions 43d is provided between the fifth conductive region 226e and a portion of the first compound region 41 in the Y-axis direction. A portion of the one of the multiple compound regions 43d may be provided between at least a portion of one of the multiple compound regions 43b and a portion of the first compound region 41 in the Y-axis direction.

According to the embodiments described above, the stability of the operations of the magnetic memory device can be improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the magnetic memory such as the magnetic layer, the nonmagnetic layer, the conductive layer, the compound region, the insulating region, the controller, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all magnetic memories practicable by an appropriate design modification by one skilled in the art based on the magnetic memories described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
a first conductive layer including a first metal and including a first portion, a second portion, and a third portion between the first portion and the second portion;
a first magnetic layer separated from the third portion in a first direction crossing a second direction, the second direction being from the first portion toward the second portion;
a first nonmagnetic layer provided between the third portion and the first magnetic layer;
a second magnetic layer provided between the third portion and the first nonmagnetic layer;

a second conductive layer including the first metal and being separated from the first conductive layer in a third direction, the third direction crossing a plane including the first direction and the second direction;

a third magnetic layer separated from the second conductive layer in the first direction;

a second nonmagnetic layer provided between the second conductive layer and the third magnetic layer;

a fourth magnetic layer provided between the second conductive layer and the second nonmagnetic layer;

a first compound region including the first metal and at least one selected from the group consisting of oxygen, nitrogen, and fluorine, at least a portion of the first compound region being provided between the first conductive layer and the second conductive layer in the third direction; and a first insulating region including at least one selected from the group consisting of Al and Si and at least one selected from the group consisting of oxygen, nitrogen, and fluorine, at least a portion of the first insulating region being provided between the first magnetic layer and the third magnetic layer.

2. The device according to claim 1, further comprising a second compound region including the first metal and at least one selected from the group consisting of oxygen, nitrogen, and fluorine, the second compound region being provided between the first compound region and the second conductive layer in the third direction, the first compound region including a first partial region and a second partial region, the second partial region being positioned between the first partial region and the second compound region in the third direction, a length in the first direction of the second partial region being shorter than a length in the first direction of the first partial region.

3. The device according to claim 2, wherein the second compound region is separated from the first compound region in the third direction, and a portion of the first insulating region is provided between at least a portion of the first compound region and at least a portion of the second compound region in the third direction.

4. The device according to claim 1, further comprising a first compound layer, the first conductive layer being provided between the second magnetic layer and at least a portion of the first compound layer in the first direction.

5. The device according to claim 4, wherein the first compound layer includes oxygen and at least one first element selected from the group consisting of Al, Mg, Ta, B, Ca, Si, Ge, Ga, In, W, Ti, Cu, Pd, and Zr.

6. The device according to claim 1, further comprising a third compound region including the first metal and at least one selected from the group consisting of oxygen, nitrogen, and fluorine, a portion of the third compound region being provided between the second magnetic layer and the first insulating region in the third direction.

7. The device according to claim 1, wherein the first compound region is further provided between the second magnetic layer and the fourth magnetic layer in the third direction.

8. The device according to claim 1, wherein the first compound region is further provided between the first nonmagnetic layer and the second nonmagnetic layer in the third direction.

9. The device according to claim 1, wherein the first compound region is further provided between the first magnetic layer and the third magnetic layer in the third direction.

10. The device according to claim 1, wherein the first insulating region is provided between a portion of the first conductive layer and a portion of the second conductive layer in the third direction.

11. The device according to claim 1, wherein the first metal includes at least one selected from the group consisting of Hf, Ta, W, Re, Os, Ir, Pt, Pd, Cu, Ag, Ru, Rh, and Au.

12. A magnetic memory device, comprising:

a first conductive layer including at least one first metal selected from a first group consisting of Hf, W, Re, Os, Ir, Pt, Pd, Cu, Ag, Ru, Rh, and Au, the first conductive layer including a first portion, a second portion, and a third portion between the first portion and the second portion;

a first magnetic layer separated from the third portion in a first direction crossing a second direction, the second direction being from the first portion toward the second portion;

a first nonmagnetic layer provided between the third portion and the first magnetic layer;

a second magnetic layer provided between the third portion and the first nonmagnetic layer;

a second conductive layer including the first metal and being separated from the first conductive layer in a third direction, the third direction crossing a plane including the first direction and the second direction;

a third magnetic layer separated from the second conductive layer in the first direction;

a second nonmagnetic layer provided between the second conductive layer and the third magnetic layer;

a fourth magnetic layer provided between the second conductive layer and the second nonmagnetic layer; and a first compound region including the first metal and at least one selected from the group consisting of oxygen, nitrogen, and fluorine, at least a portion of the first compound region being provided between the first conductive layer and the second conductive layer in the third direction.

13. A magnetic memory device, comprising:

a first conductive layer including a first portion, a second portion, and a third portion between the first portion and the second portion, the third portion including a first conductive region and a second conductive region, the first conductive region including a first metal, the second conductive region including a second metal, a direction from the second conductive region toward the first conductive region being aligned with a first direction crossing a second direction, the second direction being from the first portion toward the second portion;

a first magnetic layer separated from the third portion in the first direction, the first conductive region being positioned between the second conductive region and the first magnetic layer;

a first nonmagnetic layer provided between the first conductive region and the first magnetic layer;

a second magnetic layer provided between the first conductive region and the first nonmagnetic layer;

a second conductive layer separated from the first conductive layer in a third direction, the third direction crossing a plane including the first direction and the second direction;

a third magnetic layer separated from the second conductive layer in the first direction;
a second nonmagnetic layer provided between the second conductive layer and the third magnetic layer;
a fourth magnetic layer provided between the second conductive layer and the second nonmagnetic layer; and
a first compound region including the second metal and at least one selected from the group consisting of oxygen, nitrogen, and fluorine, at least a portion of the first compound region being provided between the first conductive layer and the second conductive layer in the third direction.

14. The device according to claim 13, further comprising a second compound region including the second metal and at least one selected from the group consisting of oxygen, nitrogen, and fluorine,
the second compound region being provided between the first compound region and the second conductive layer in the third direction,
the first compound region including a first partial region and a second partial region, the second partial region being positioned between the first partial region and the second compound region in the third direction,
a length in the first direction of the second partial region being shorter than a length in the first direction of the first partial region.

15. The device according to claim 13, further comprising a third compound region including the first metal and at least one selected from the group consisting of oxygen, nitrogen, and fluorine,
a portion of the third compound region being provided between the second magnetic layer and the first compound region.

16. The device according to claim 13, wherein the first metal includes at least one selected from the group consisting of Ta, Pt, Au, W, Rh, Ir, Re, Ru, Cu, Hf, and Pd.

17. The device according to claim 13, wherein the second metal includes at least one selected from the group consisting of Hf, Zr, Ti, Nb, V, and Al.

18. The device according to claim 13, wherein
the third portion further includes a third conductive region including a third metal, and
the first conductive region and the second conductive region are positioned between the third conductive region and the second magnetic layer in the second direction.

19. The device according to claim 18, wherein the third metal includes at least one selected from the group consisting of Al, Cu, and Sc.

20. The device according to claim 13, wherein
the second conductive layer includes:
a fourth conductive region including a first metal; and
a fifth conductive region including the second metal, and
the fourth conductive region is positioned between the fifth conductive region and the fourth magnetic layer in the first direction.

21. The device according to claim 1, further comprising a controller electrically connected to the first portion and the second portion,
the controller performs:
a first operation of supplying a first current to the first conductive layer from the first portion toward the second portion; and
a second operation of supplying a second current to the first conductive layer from the second portion toward the first portion.

* * * * *